United States Patent
Kwon et al.

(10) Patent No.: US 11,217,286 B2
(45) Date of Patent: *Jan. 4, 2022

(54) SEMICONDUCTOR MEMORY DEVICE WITH POWER DOWN OPERATION

(71) Applicant: SK hynix Inc., Icheon-si Gyeonggi-do (KR)

(72) Inventors: Ki Hun Kwon, Seoul (KR); Jae Il Kim, Yongin-si Gyeonggi-do (KR); Dae Suk Kim, Icheon-si Gyeonggi-do (KR)

(73) Assignee: SK hynix Inc., Icheon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/900,636

(22) Filed: Jun. 12, 2020

(65) Prior Publication Data

US 2020/0302980 A1    Sep. 24, 2020

Related U.S. Application Data

(63) Continuation-in-part of application No. 16/288,368, filed on Feb. 28, 2019, now Pat. No. 10,847,195.
(Continued)

(30) Foreign Application Priority Data

Jun. 27, 2016   (KR) .................. 10-2016-0080213
Aug. 2, 2016    (KR) .................. 10-2016-0098422
(Continued)

(51) Int. Cl.
*G11C 7/22*      (2006.01)
*G11C 7/10*      (2006.01)
(Continued)

(52) U.S. Cl.
CPC .............. *G11C 7/222* (2013.01); *G11C 7/109* (2013.01); *G11C 5/063* (2013.01); *G11C 8/12* (2013.01)

(58) Field of Classification Search
CPC ......... G11C 7/222; G11C 7/109; G11C 5/063; G11C 8/12
(Continued)

(56) References Cited

U.S. PATENT DOCUMENTS 4,811,305 A       3/1989  Watanabe et al.
5,828,592 A *    10/1998  Tran ...................... G11C 29/44
                                                                365/45
(Continued)

FOREIGN PATENT DOCUMENTS

KR         101065336 B1      9/2011
KR      1020130031650 A      3/2013
(Continued)

*Primary Examiner* — Sung Il Cho
(74) *Attorney, Agent, or Firm* — William Park & Associates Ltd.

(57) ABSTRACT

A semiconductor system may include a first semiconductor device and a second semiconductor device. The first semiconductor device may be configured to output a reset signal, command/address signals and data. The second semiconductor device may be configured to enable a start signal and an oscillation signal based on the reset signal. The oscillation signal starts to oscillate in response to the reset signal.

19 Claims, 31 Drawing Sheets

Related U.S. Application Data which is a continuation-in-part of application No. 16/237,344, filed on Dec. 31, 2018, now Pat. No. 10,685,697, which is a continuation-in-part of application No. 16/206,790, filed on Nov. 30, 2018, now Pat. No. 10,777,241, which is a continuation of application No. 15/625,503, filed on Jun. 16, 2017, now Pat. No. 10,147,471, which is a continuation of application No. 15/622,507, filed on Jun. 14, 2017, now Pat. No. 10,181,346, which is a continuation of application No. 15/617,097, filed on Jun. 8, 2017, now Pat. No. 10,373,662.

(30) Foreign Application Priority Data

| Aug. 2, 2016 | (KR) | 10-2016-0098423 |
| Aug. 2, 2016 | (KR) | 10-2016-0098425 |
| May 19, 2017 | (KR) | 10-2017-0062099 |

(51) Int. Cl.
   *G11C 8/12* (2006.01)
   *G11C 5/06* (2006.01)

(58) Field of Classification Search
   USPC .......................................................... 365/191
   See application file for complete search history.

(56) References Cited

U.S. PATENT DOCUMENTS

| 6,000,004 | A | 12/1999 | Fukumoto |
| 6,975,547 | B2 | 12/2005 | Byeon et al. |
| 7,142,461 | B2 * | 11/2006 | Janzen ............... G06F 13/4086 365/189.14 |
| 7,196,966 | B2 * | 3/2007 | Jin ..................... G11C 7/1057 365/233.11 |
| 7,475,184 | B2 | 1/2009 | Lee |
| 7,656,722 | B2 | 2/2010 | Song |
| 8,493,809 | B2 | 7/2013 | Lee |
| 9,449,665 | B1 | 9/2016 | Kim et al. |
| 10,115,441 | B1 | 10/2018 | Yang et al. |
| 2001/0011916 | A1 * | 8/2001 | Douchi ............... H03K 5/2481 327/291 |
| 2001/0017806 | A1 | 8/2001 | Schamberger et al. |
| 2002/0085419 | A1 | 7/2002 | Kwon et al. |
| 2002/0185337 | A1 | 12/2002 | Miura et al. |
| 2003/0099138 | A1 * | 5/2003 | Kyung ................ G11C 11/4076 365/200 |
| 2004/0049629 | A1 | 3/2004 | Miura et al. |
| 2004/0090242 | A1 | 5/2004 | Lee et al. |
| 2004/0123036 | A1 | 6/2004 | Hammitt et al. |
| 2004/0179420 | A1 * | 9/2004 | Kyung ................ G11C 7/1078 365/233.1 |
| 2004/0193777 | A1 | 9/2004 | LaBerge |
| 2005/0046139 | A1 | 3/2005 | Guan |
| 2005/0047239 | A1 | 3/2005 | Takahashi et al. |
| 2006/0002201 | A1 | 1/2006 | Janzen |
| 2006/0023515 | A1 | 2/2006 | Kishi et al. |
| 2006/0245287 | A1 | 11/2006 | Seitz et al. |
| 2008/0164904 | A1 * | 7/2008 | Kim .................... G11C 7/1051 326/30 |
| 2008/0201548 | A1 | 8/2008 | Przybylski et al. |
| 2008/0307132 | A1 | 12/2008 | Zaks et al. |
| 2009/0097341 | A1 | 4/2009 | Jeong |
| 2009/0225623 | A1 * | 9/2009 | Walker ................ G11C 8/00 365/238.5 |
| 2009/0249097 | A1 | 10/2009 | Lam et al. |
| 2009/0285034 | A1 | 11/2009 | Fujisawa |
| 2010/0054059 | A1 | 3/2010 | Yoon et al. |
| 2010/0162053 | A1 | 6/2010 | Gillingham |
| 2010/0182817 | A1 * | 7/2010 | Koshizuka ............ G11C 8/04 365/51 |
| 2010/0208534 | A1 | 8/2010 | Fujisawa |
| 2010/0208535 | A1 | 8/2010 | Fujisawa |
| 2010/0220536 | A1 | 9/2010 | Coteus et al. |
| 2010/0302893 | A1 * | 12/2010 | Sato ..................... G11C 11/4072 365/227 |
| 2011/0205832 | A1 | 8/2011 | Jeon |
| 2012/0127807 | A1 | 5/2012 | Pio |
| 2012/0182816 | A1 | 7/2012 | Ide et al. |
| 2012/0195144 | A1 | 8/2012 | Ide et al. |
| 2012/0243365 | A1 | 9/2012 | Kanda et al. |
| 2012/0272013 | A1 | 10/2012 | Liou |
| 2012/0284480 | A1 | 11/2012 | Williams et al. |
| 2013/0028038 | A1 * | 1/2013 | Fujisawa ............. G11C 11/4074 365/222 |
| 2013/0103988 | A1 | 4/2013 | Ishimi |
| 2013/0151757 | A1 | 6/2013 | Beom |
| 2013/0297894 | A1 | 11/2013 | Cohen et al. |
| 2013/0305074 | A1 * | 11/2013 | Ellis ................... G11C 7/02 713/324 |
| 2014/0281135 | A1 | 9/2014 | Balakrishnan et al. |
| 2014/0289448 | A1 | 9/2014 | Koudele |
| 2014/0292397 | A1 | 10/2014 | Choi |
| 2014/0379961 | A1 | 12/2014 | Lasser |
| 2014/0380015 | A1 | 12/2014 | Lasser |
| 2015/0036439 | A1 | 2/2015 | Lee |
| 2015/0213889 | A1 | 7/2015 | Miura et al. |
| 2015/0228319 | A1 | 8/2015 | Cheon |
| 2016/0071574 | A1 | 3/2016 | Hess et al. |
| 2017/0110173 | A1 * | 4/2017 | Matsuno ............. G11C 11/4076 |
| 2019/0189194 | A1 * | 6/2019 | Kim .................... G11C 7/1063 |
| 2019/0259431 | A1 | 8/2019 | Penney et al. |
| 2020/0098422 | A1 | 3/2020 | Nguyen et al. |
| 2020/0125257 | A1 | 4/2020 | Shin et al. |

FOREIGN PATENT DOCUMENTS

| KR | 20150025782 A | 3/2015 |
| KR | 1020150095494 A | 8/2015 |
| KR | 20160023359 A | 3/2016 |

* cited by examiner

FIG. 12

| OPERATION | CS | CMD<1> | CMD<2> | CMD<3> | CMD<4> | CMD<5> | TLCA |
|---|---|---|---|---|---|---|---|
| POWER DOWN ENTRY | L | H | L | H | H | H | L |
| | L | | | | | | |
| POWER DOWN EXIT | H | H | H | H | H | H | L |
| | L | | | | | | |

FIG. 13

| OPERATION | CS | CMD<1> | CMD<2> | CMD<3> | CMD<4> | CMD<5> | TLCA |
|---|---|---|---|---|---|---|---|
| SELF REFRESH ENTRY | L | H | L | H | H | H | H |
| | L | | | | | | |
| SELF REFRESH EXIT | H | H | H | H | H | H | H |
| | L | | | | | | |

SEMICONDUCTOR MEMORY DEVICE WITH POWER DOWN OPERATION

CROSS-REFERENCE TO RELATED APPLICATION

The present application is a continuation-in-part application of U.S. patent application Ser. No. 16/288,368, filed on Feb. 28, 2019, which is a continuation application of U.S. patent application Ser. No. 15/617,097, filed on Jun. 8, 2017, and claims priority under 35 U.S.C 119(a) to Korean Application No. 10-2016-0080213, filed on Jun. 27, 2016, which is incorporated herein by reference in its entirety. The present application is also a continuation-in-part application of U.S. patent application Ser. No. 16/206,790, filed on Nov. 30, 2018, which is a continuation application of U.S. patent application Ser. No. 15/625,503, filed on Jun. 16, 2017, and claims priority under 35 U.S.C 119(a) to Korean Application No. 10-2016-0098422, filed on Aug. 2, 2016 and Korean Application No. 10-2016-0098423, filed on Aug. 2, 2016, which are incorporated herein by reference in its entirety. The present application is also a continuation-in-part application of U.S. patent application Ser. No. 16/237,344, filed on Dec. 31, 2018, which is a continuation application of U.S. patent application Ser. No. 15/622,507, filed on Jun. 14, 2017, and claims priority under 35 U.S.C 119(a) to Korean Application No. 10-2016-0098425, filed on Aug. 2, 2016 and Korean Application No. 10-2017-0062099, filed on May 19, 2017, which are incorporated herein by reference in its entirety.

BACKGROUND

1. Technical Field

Embodiments of the present disclosure may generally relate to semiconductor devices and, more particularly, to semiconductor devices configured to perform various operations.

2. Related Art

Internal set values of a semiconductor device have to be initialized to have initial values before the semiconductor device operates. Thus, an initialization operation of the semiconductor device may be very important for normal operations of the semiconductor device.

A chip such as the semiconductor device having various functions may consist of a plurality of circuits, initial conditions of which are necessarily set to perform correct active operations. The initialization operation for setting the initial conditions has to be performed before the active operations of the chip are performed.

In addition, the semiconductor device may store data therein or may output the stored data according to an operation mode. For example, if a controller requires to access data stored in the semiconductor device, the semiconductor may perform a read operation to output the data stored in memory cells corresponding to an address received from the controller. In contrast, if the controller needs to store data in the semiconductor device, the semiconductor may perform a write operation to store the data into the memory cells corresponding to an address received from the controller.

Semiconductor devices, for example, dynamic random access memory (DRAM) devices may be designed to operate at a high speed with low power consumption and have large cell capacitance. Thus, most semiconductor devices may be designed to have a power-down mode for minimizing a driving current when data is not accessed. If the semiconductor devices are in the power-down mode, the semiconductor devices may terminate generation of internal voltages for driving internal circuits of the semiconductor devices. The semiconductor devices may enter the power-down mode in response to a clock enablement signal (CKE) outputted from an external chip set device. The clock enablement signal (CKE) is a signal that transmits a clock signal for performing an input/output (I/O) operation of data to a memory area of the semiconductor device.

DRAM devices among the semiconductor devices may lose data stored in their memory cells as time elapses even while their power supplies are applied thereto. This is in contrast to static random access memory (SRAM) devices or flash memory devices. In order to prevent the data stored in the DRAM cells from being lost, the DRAM devices may be basically accompanied with an operation for rewriting the data from external systems in a certain period, which is called "a refresh operation".

Synchronous semiconductor devices may receive commands and addresses in synchronization with a clock signal. Double data rate (DDR) synchronous semiconductor devices may receive the commands and the addresses in synchronization with every rising edge and every falling edge of the clock signal, and single data rate (SDR) synchronous semiconductor devices may receive the commands and the addresses in synchronization with every rising edge of the clock signal.

SUMMARY

According to an embodiment, a semiconductor system may be provided. The semiconductor system may include a first semiconductor device and a second semiconductor device. The first semiconductor device may be configured to output a reset signal, command/address signals, and data. The second semiconductor device may be configured to enable a start signal and an oscillation signal based on the reset signal. The oscillation signal starts to oscillate in response to the reset signal.

According to another embodiment, a semiconductor device may include a refresh signal generation circuit configured to generate a refresh signal, indicating that a refresh operation is activated, based on command signals. The semiconductor device may also include a power-down signal generation circuit configured to generate a power-down signal based on the command signals, the generation of the power-down signal indicating that a power-down operation is activated, the power-down signal being enabled after the refresh operation terminates.

According to another embodiment, a semiconductor device may include a first rank and a second rank. The first rank is configured to operate in synchronization with a clock signal in response to a first rank selection signal. The second rank is configured to operate in synchronization with the clock signal in response to a second rank selection signal. The first rank performs a termination operation without performing a memory access operation when the first rank selection signal is maintained at an enabled state during two cycles of the clock signal. The first rank also performs the memory access operation when the first rank selection signal has an enabled state at a first edge of the clock signal and has a disabled state at a second edge of the clock signal.

BRIEF DESCRIPTION OF THE DRAWINGS

FIG. 12 is a table illustrating a power-down operation of a semiconductor device according to an embodiment.

FIG. 13 is a table illustrating a refresh operation of a semiconductor device according to an embodiment.

DETAILED DESCRIPTION

Figure 1:
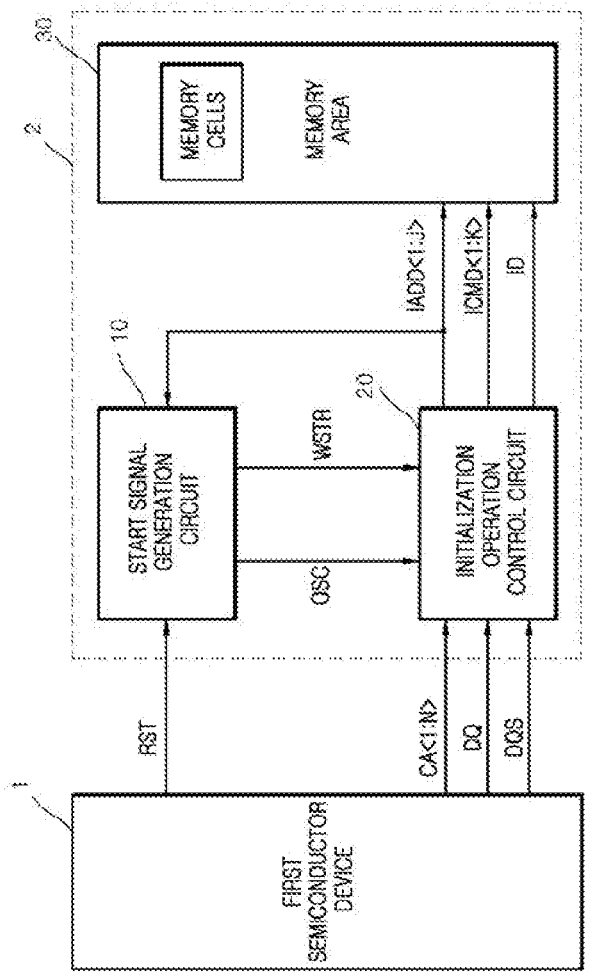
FIG. 1 is a block diagram illustrating a representation of an example of a configuration of a semiconductor system according to an embodiment.

Various embodiments of the present disclosure will be described hereinafter with reference to the accompanying drawings. However, the embodiments described herein are for illustrative purposes only and are not intended to limit the scope of the present disclosure.

The drawings might not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Various embodiments may be directed to semiconductor devices performing an initialization operation and semiconductor systems including the same.

Referring to FIG. 1, a semiconductor system according to an embodiment may include a first semiconductor device 1 and a second semiconductor device 2. The second semiconductor device 2 may include a start signal generation circuit 10, an initialization operation control circuit 20 and a memory area 30.

The first semiconductor device 1 may output a reset signal RST, first to $N^{th}$ command/address signals CA<1:N>, data DQ and a strobe signal DQS. The reset signal RST may be set to be a signal which is enabled to perform an initialization operation of the second semiconductor device 2. The reset signal RST may be set to be a signal which is enabled after a power-up period that a power supply voltage used in the second semiconductor device 2 reaches a target voltage level from a ground voltage level along a level of an external supply voltage. The first to $N^{th}$ command/address signals CA<1:N> and the data DQ may be transmitted through signal lines that transmit at least one group of addresses, commands and data. The number "N" of bits of the first to $N^{th}$ command/address signals CA<1:N> may be set to be a natural number. Some bits of the first to $N^{th}$ command/address signals CA<1:N> may correspond to a command for controlling operations of the second semiconductor device 2. Some other bits of the first to $N^{th}$ command/address signals CA<1:N> may correspond to an address for selecting memory cells of the second semiconductor device 2. Although FIG. 1 illustrates the data DQ line with a single signal line, the data DQ may be set to include a plurality of bits according to the embodiments. The strobe signal DQS may be set to be a signal for strobing the data DQ.

According to an embodiment, the first semiconductor device 1 may transmit the data DQ to the second semiconductor device 2 through a data bus. The first semiconductor device 1 may not transmit the data DQ to the second semiconductor device 2 during the initialization operation. The first semiconductor device 1 may transmit the strobe signal DQS to the second semiconductor device 2. The strobe signal DQS may not be toggled during the initialization operation. The first semiconductor device 1 may calculate a write recovery time tWR from a clock signal (not illustrated) while the initialization operation is performed. The write recovery time tWR may be set to a time period from a point of time that the last data DQ are outputted from the first semiconductor device 1 till a point time that a pre-charge operation is performed.

The start signal generation circuit 10 may generate an oscillation signal OSC including pulses which are periodi-
cally created in response to the reset signal RST and may also generate a start signal WSTR which is enabled in response to the reset signal RST. The start signal generation circuit 10 may generate the oscillation signal OSC including the pulses which are periodically created if the reset signal RST is enabled for execution of the initialization operation. The start signal generation circuit 10 may generate the start signal WSTR which is enabled from a point of time that a level of the reset signal RST is changed to perform the initialization operation till a point of time that all of bits of first to $J^{th}$ internal addresses IADD<1:J> are counted. An operation of the start signal generation circuit 10 for generating the start signal WSTR will be described later.

The initialization operation control circuit 20 may generate the first to $J^{th}$ internal addresses IADD<1:J>, first to $K^{th}$ internal commands ICMD<1:K> and internal data ID for the initialization operation in response to the oscillation signal OSC and the start signal WSTR. The initialization operation control circuit 20 may generate the first to $J^{th}$ internal addresses IADD<1:J> which are sequentially counted and the first to $K^{th}$ internal commands ICMD<1:K> which are sequentially counted in response to the pulses of the oscillation signal OSC while the start signal WSTR is enabled. The initialization operation control circuit 20 may generate the internal data ID having predetermined logic levels in response to the pulses of the oscillation signal OSC while the start signal WSTR is enabled. The initialization operation control circuit 20 may stop receiving the first to $N^{th}$ command/address signals CA<1:N> and the data DQ while the start signal WSTR is enabled. The initialization operation control circuit 20 may output the data DQ as the internal data ID in synchronization with the strobe signal DQS after the initialization operation. The number "3" of the bits included in the first to $J^{th}$ internal addresses IADD<1:J> and the number "K" of the bits included in the first to $K^{th}$ internal commands ICMD<1:K> may be set to be natural numbers which are less than the natural number "N". Although FIG. 1 illustrates the internal data ID line with a single signal line, the internal data ID may be set to include a plurality of bits according to the embodiments.

The memory area 30 may include a plurality of memory cells and may store the internal data ID into the memory cells selected by the first to $J^{th}$ internal addresses IADD<1:J> in response to the first to $K^{th}$ internal commands ICMD<1:K>. The memory area 30 may be realized to include a nonvolatile memory device or a volatile memory device according to the embodiments. The internal data ID stored in the memory cells during the initialization operation may have the same logic level. In such a case, the logic level of the internal data ID may be set to a logic "high" level or a logic "low" level according to the embodiments.

The second semiconductor device 2 having an aforementioned configuration may generate the first to $K^{th}$ internal commands ICMD<1:K>, the first to $J^{th}$ internal addresses IADD<1:J> and the internal data ID for performing the initialization operation according to the start signal WSTR generated in response to the reset signal RST. The second semiconductor device 2 may store the internal data ID in the memory cells selected by the first to $K^{th}$ internal commands ICMD<1:K> and the first to $J^{th}$ internal addresses IADD<1:J> during the initialization operation. The second semiconductor device 2 may store the data DQ in the memory cells selected by the first to $N^{th}$ command/address signals CA<1:N> during a write operation after the initialization operation terminates. The second semiconductor device 2 may output the data DQ stored in the memory cells selected by the first to N$^{th}$ command/address signals CA<1:N> during a read operation after the initialization operation terminates.

The second semiconductor device 2 according to an embodiment may include an on-die termination (ODT) circuit (i.e., see FIG. 10) for preventing distortion of the data DQ. The ODT circuit may not be turned on during the initialization operation.

Figure 2:
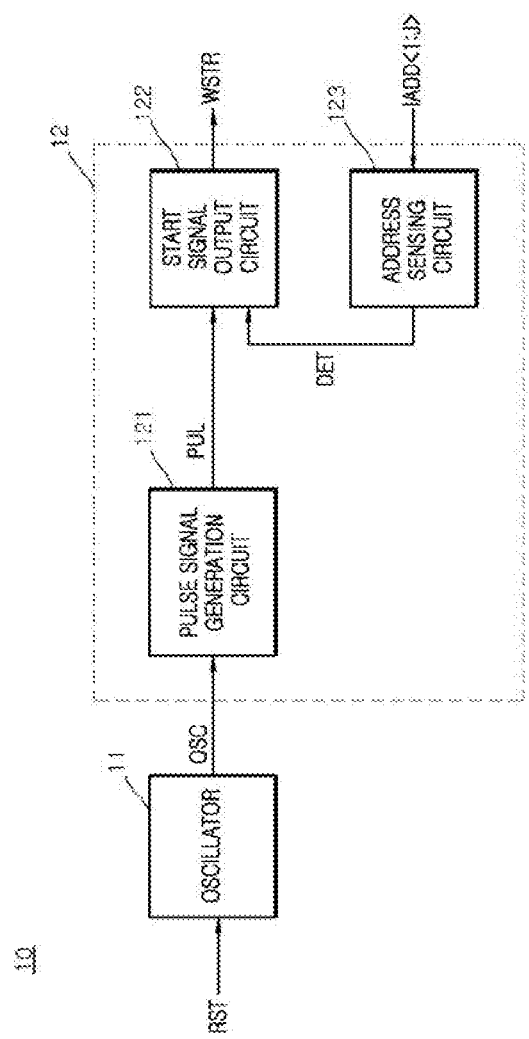
FIG. 2 is a block diagram illustrating a representation of an example of a configuration of an example of a start signal generation circuit included in the semiconductor system of FIG. 1.

Referring to FIG. 2, the start signal generation circuit 10 may include an oscillator 11 and a start signal driving circuit 12. The start signal driving circuit 12 may include a pulse signal generation circuit 121, a start signal output circuit 122 and an address sensing circuit 123.

The oscillator 11 may generate the oscillation signal OSC including the pulses which are periodically created in response to the reset signal RST. The oscillator 11 may generate the oscillation signal OSC including the pulses which are periodically created if a level of the reset signal RST is changed from a logic "low" level into a logic "high" level. The oscillator 11 may be realized using a general ring oscillator or any one of various circuits generating signals having a cycle time. Further, the logic levels of the signals may be different from or the opposite of those described. For example, a signal described as having a logic "high" level may alternatively have a logic "low" level, and a signal described as having a logic "low" level may alternatively have a logic "high" level.

The pulse signal generation circuit 121 may generate a pulse signal PUL including a pulse which is created after a predetermined period in response to the oscillation signal OSC. The pulse signal generation circuit 121 may generate the pulse signal PUL including a pulse which is created when the pulses of the oscillation signal OSC are inputted to the pulse signal generation circuit 121 by a predetermined number of times. The predetermined period may be set to correspond to a boot-up operation period of the second semiconductor device 2 or a period setting information that controls internal operations of the second semiconductor device 2. The pulse signal generation circuit 121 may be realized using an end clock generator 400b as shown in FIG. 1 of U.S. Pat. No. 6,975,547.

The start signal output circuit 122 may generate the start signal WSTR which is enabled in response to the pulse signal PUL and a detection signal DET while the initialization operation is performed. The start signal output circuit 122 may generate the start signal WSTR which is enabled in response to a pulse of the pulse signal PUL and which is disabled in response to a pulse of the detection signal DET. The start signal output circuit 122 may be realized a pulse output unit 222 as shown in FIG. 3 of Pub No. US 2015/0036439.

Figure 9:
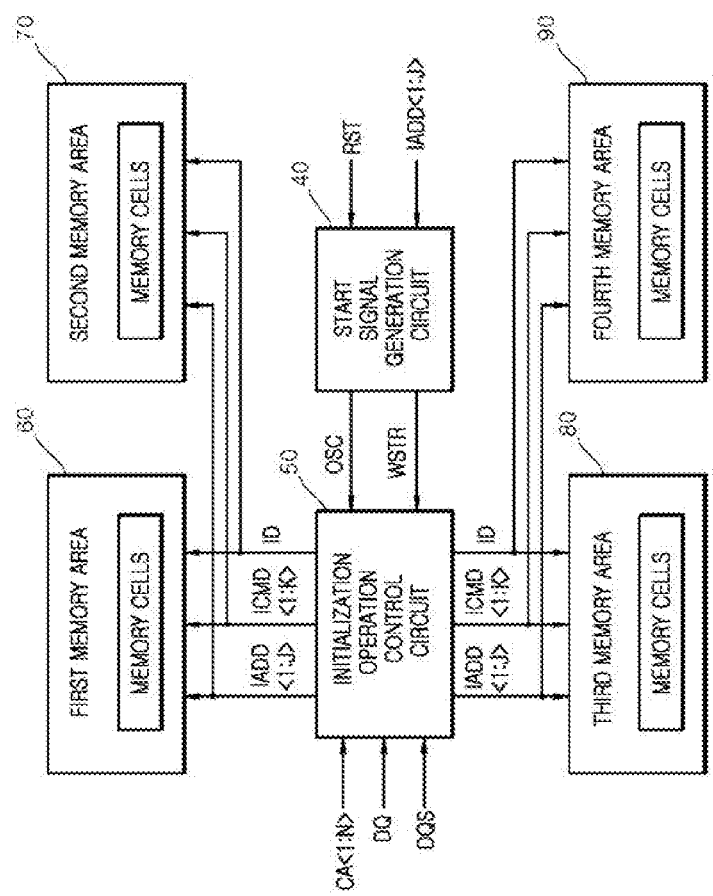
FIG. 9 is a block diagram illustrating a representation of an example of a configuration of a semiconductor device employed in a semiconductor system according to an embodiment.

The address sensing circuit 123 may sense the first to J$^{th}$ internal addresses IADD<1:J> to generate the detection signal DET which is enabled if a combination of the first to J$^{th}$ internal addresses IADD<1:J> is consistent with a predetermined combination. The address sensing circuit 123 may generate the detection signal DET including a pulse which is created if all of bits of the first to J$^{th}$ internal addresses IADD<1:J> are counted. The address sensing circuit 123 may be realized a second address compare circuit 270 as shown in FIG. 9 of U.S. Pat. No. 6,975,547.

The start signal driving circuit 12 having an aforementioned configuration may generate the start signal WSTR which is enabled in response to the oscillation signal OSC and which is disabled if all of bits of the first to J$^{th}$ internal addresses IADD<1:J> are counted.

Figure 3:
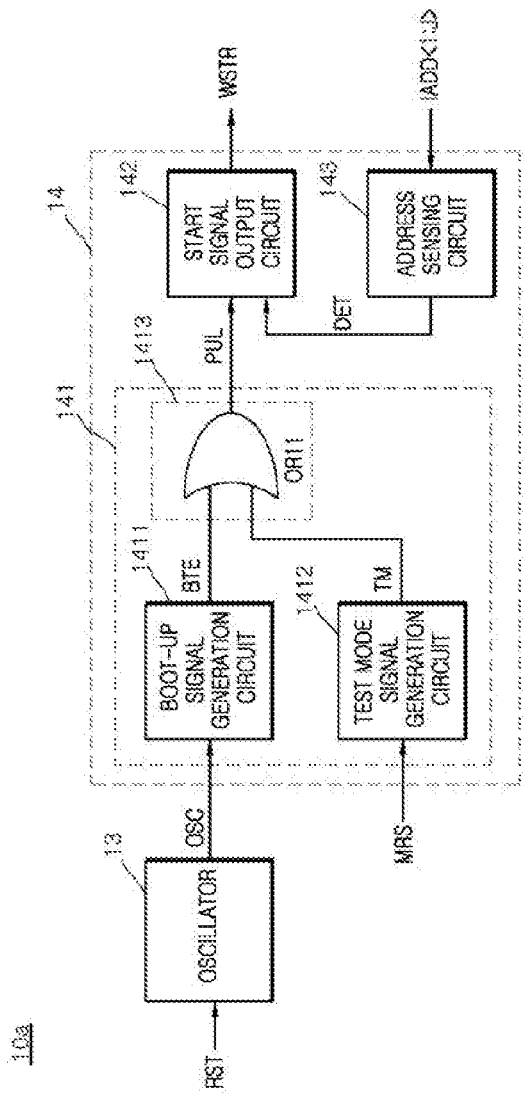
FIG. 3 is a block diagram illustrating a representation of an example of a configuration of another example of a start signal generation circuit included in the semiconductor system of FIG. 1.

Referring to FIG. 3, a start signal generation circuit 10a being able to replace the start signal generation circuit 10 may include an oscillator 13 and a start signal driving circuit 14. The start signal driving circuit 14 may include a pulse signal generation circuit 141, a start signal output circuit 142 and an address sensing circuit 143.

The oscillator 13 may generate the oscillation signal OSC including the pulses which are periodically created in response to the reset signal RST. The oscillator 13 may generate the oscillation signal OSC including the pulses which are periodically created if a level of the reset signal RST is changed from a logic "low" level into a logic "high" level. The oscillator 13 may be realized using a general ring oscillator or any one of various circuits generating signals having a cycle time. Further, the logic levels of the signals may be different from or the opposite of those described. For example, a signal described as having a logic "high" level may alternatively have a logic "low" level, and a signal described as having a logic "low" level may alternatively have a logic "high" level.

The pulse signal generation circuit 141 may include a boot-up signal generation circuit 1411, a test mode signal generation circuit 1412 and a logic circuit 1413.

The boot-up signal generation circuit 1411 may generate a boot-up signal BTE including a pulse which is created after a predetermined period in response to the oscillation signal OSC. The boot-up signal generation circuit 1411 may generate the boot-up signal BTE including a pulse which is created when the pulses of the oscillation signal OSC are inputted to the boot-up signal generation circuit 1411 by a predetermined number of times. The predetermined period may be set to correspond to a boot-up operation period in which a plurality of fuse data of the second semiconductor device 2 are generated.

The test mode signal generation circuit 1412 may generate a test mode signal TM including a pulse which is created after a predetermined period in response to a mode set signal MRS. The predetermined period may be set to be a period for setting a mode register set that controls internal operations of the second semiconductor device 2.

The logic circuit 1413 may be realized using a logic OR gate OR11 to output the boot-up signal BTE or the test mode signal TM as the pulse signal PUL. The logic circuit 1413 may execute a logical OR operation of the boot-up signal BTE and the test mode signal TM to generate the pulse signal PUL.

The start signal output circuit 142 may generate the start signal WSTR which is enabled in response to the pulse signal PUL and the detection signal DET while the initialization operation is performed. The start signal output circuit 142 may generate the start signal WSTR which is enabled in response to a pulse of the pulse signal PUL and which is disabled in response to a pulse of the detection signal DET.

The address sensing circuit 143 may sense the first to J$^{th}$ internal addresses IADD<1:J> to generate the detection signal DET which is enabled if a combination of the first to J$^{th}$ internal addresses IADD<1:J> is consistent with a predetermined combination. The address sensing circuit 143 may generate the detection signal DET including a pulse which is created if all of bits of the first to J$^{th}$ internal addresses IADD<1:J> are counted.

The start signal driving circuit 14 having an aforementioned configuration may generate the start signal WSTR which is enabled in response to the oscillation signal OSC or the mode set signal MRS and which is disabled if all of the bits of the first to J$^{th}$ internal addresses IADD<1:J> are counted.

Figure 4:
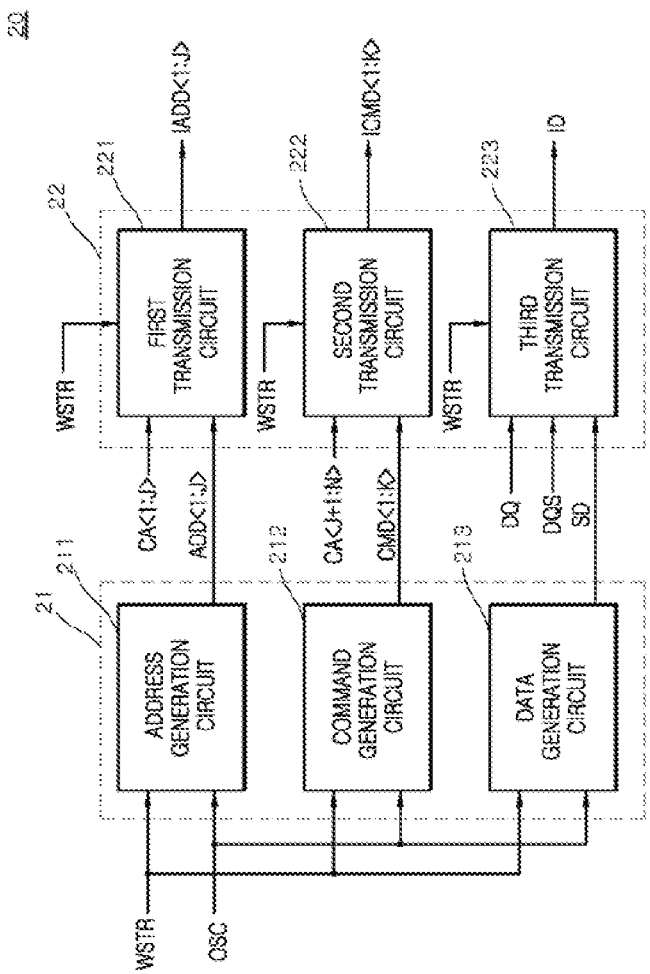
FIG. 4 is a block diagram illustrating a representation of an example of a configuration of an initialization operation control circuit included in the semiconductor system of FIG. 1.

Referring to FIG. 4, the initialization operation control circuit 20 may include an internal signal generation circuit 21 and an input control circuit 22.

The internal signal generation circuit 21 may include an address generation circuit 211, a command generation circuit 212 and a data generation circuit 213.

The address generation circuit 211 may generate first to $J^{th}$ addresses ADD<1:J> that are sequentially counted in response to the pulses of the oscillation signal OSC while the start signal WSTR is enabled. The address generation circuit 211 may count up the first to $J^{th}$ addresses ADD<1:J>, all bits of which have a logic "low" level, whenever every pulse of the oscillation signal OSC is inputted, thereby generating the first to $J^{th}$ addresses ADD<1:J>, all bits of which have a logic "high" level. Further, the logic levels of the signals may be different from or the opposite of those described. For example, a signal described as having a logic "high" level may alternatively have a logic "low" level, and a signal described as having a logic "low" level may alternatively have a logic "high" level. The address generation circuit 211 may be realized an address counting unit 30 as shown in FIG. 3 of U.S. Pat. No. 8,493,809.

The command generation circuit 212 may generate first to $K^{th}$ commands CMD<1:K> in response to the pulses of the oscillation signal OSC while the start signal WSTR is enabled. The command generation circuit 212 may alternatively and repeatedly generate the first to $K^{th}$ commands CMD<1:K> for an active operation and the first to $K^{th}$ commands CMD<1:K> for the write operation, whenever every pulse of the oscillation signal OSC is inputted.

The data generation circuit 213 may generate storage data SD having a predetermined logic level in response to the pulses of the oscillation signal OSC while the start signal WSTR is enabled. The data generation circuit 213 may generate the storage data SD having a logic "low" level whenever every pulse of the oscillation signal OSC is inputted. Alternatively, the data generation circuit 213 may generate the storage data SD having a logic "high" level whenever every pulse of the oscillation signal OSC is inputted, according to the embodiments.

The internal signal generation circuit 21 having an aforementioned configuration may generate the first to $J^{th}$ addresses ADD<1:J> that are sequentially counted, the first to $K^{th}$ commands CMD<1:K> that are sequentially counted, and the storage data SD having a predetermined logic level, in response to the pulses of the oscillation signal OSC while the start signal WSTR is enabled.

The input control circuit 22 may include a first transmission circuit 221, a second transmission circuit 222 and a third transmission circuit 223.

The first transmission circuit 221 may output the first to $J^{th}$ addresses ADD<1:J> or the first to $J^{th}$ command/address signals CA<1:J> as the first to $J^{th}$ internal addresses IADD<1:J> in response to the start signal WSTR. The first transmission circuit 221 may output the first to $J^{th}$ addresses ADD<1:J> as the first to $J^{th}$ internal addresses IADD<1:J> while the start signal WSTR is enabled. The first transmission circuit 221 may output the first to $J^{th}$ command/address signals CA<1:J> as the first to $J^{th}$ internal addresses IADD<1:J> while the start signal WSTR is disabled. The first to $J^{th}$ command/address signals CA<1:J> may be set to include some bits of the first to $N^{th}$ command/address signals CA<1:N>.

The second transmission circuit 222 may output the first to $K^{th}$ commands CMD<1:K> or the (J+1)$^{th}$ to $N^{th}$ command/address signals CA<J+1:N> as the first to $K^{th}$ internal commands ICMD<1:K> in response to the start signal WSTR. The second transmission circuit 222 may output the first to $K^{th}$ commands CMD<1:K> as the first to $K^{th}$ internal commands ICMD<1:K> while the start signal WSTR is enabled. The second transmission circuit 222 may output the (J+1)$^{th}$ to $N^{th}$ command/address signals CA<J+1:N> as the first to $K^{th}$ internal commands ICMD<1:K> while the start signal WSTR is disabled. The (J+1)$^{th}$ to $N^{th}$ command/address signals CA<J+1:N> may be set to include the remaining bits of the first to $N^{th}$ command/address signals CA<1:N> other than the bits of the first to $J^{th}$ command/address signals CA<1:J>. A sum of the number "3" of the bits included in the first to $J^{th}$ internal addresses IADD<1:J> and the number "K" of the bits included in the first to $K^{th}$ commands CMD<1:K> may be set to be equal to the number "N" of the bits included in the first to $N^{th}$ command/address signals CA<1:N>.

The third transmission circuit 223 may output the storage data SD or the data DQ as the internal data ID in response to the start signal WSTR. The third transmission circuit 223 may output the storage data SD as the internal data ID while the start signal WSTR is enabled. The third transmission circuit 223 may output the data DQ as the internal data ID while the start signal WSTR is disabled. The third transmission circuit 223 may output the data DQ as the internal data ID in synchronization with the strobe signal DQS while the start signal WSTR is disabled.

The input control circuit 22 having an aforementioned configuration may output the first to $J^{th}$ addresses ADD<1:J> or the first to $J^{th}$ command/address signals CA<1:J> as the first to $J^{th}$ internal addresses IADD<1:J>, may output the first to $K^{th}$ commands CMD<1:K> or the (J+1)$^{th}$ to $N^{th}$ command/address signals CA<J+1:N> as the first to $K^{th}$ internal commands ICMD<1:K>, and may output the storage data SD or the data DQ as the internal data ID, in response to the start signal WSTR.

Figure 5:
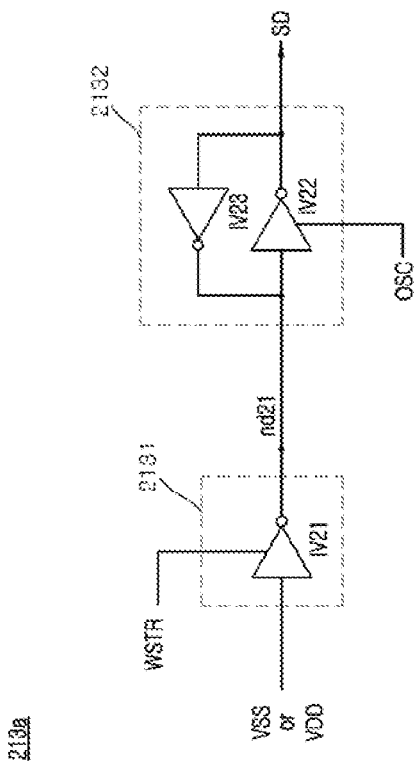
FIG. 5 is a circuit diagram illustrating a representation of an example of a configuration of an example of a data generation circuit included in the initialization operation control circuit of FIG. 4.

Referring to FIG. 5, a data generation circuit 213a corresponding to an example of the data generation circuit 213 of FIG. 4 may include a buffer circuit 2131 and a first latch circuit 2132.

The buffer circuit 2131 may be realized using an inverter IV21 and may inversely buffer a ground voltage VSS or a power supply voltage VDD to output the inversely buffered voltage to a node nd21 in response to the start signal WSTR. The inverter IV21 may be realized using a tri-state inverter. Thus, the inverter IV21 may inversely buffer the ground voltage VSS or the power supply voltage VDD to output the inversely buffered voltage to the node nd21 if the start signal WSTR has a logic "high" level. The buffer circuit 2131 may pull up the node nd21 in response to the ground voltage VSS if the start signal WSTR has a logic "high" level. The buffer circuit 2131 may pull down the node nd21 in response to the power supply voltage VDD if the start signal WSTR has a logic "high" level.

The first latch circuit 2132 may be realized using inverters IV22 and IV23 and may inversely buffer and latch a signal of the node nd21 to generate the storage data SD in response to the pulses of the oscillation signal OSC. That is, the first latch circuit 2132 may inversely buffer and latch a signal of the node nd21 to generate the storage data SD. The first latch circuit 2132 may be realized using a general latch circuit including the two inverters IV22 and IV23. The inverter IV22 may be realized using a tri-state inverter and may inversely buffer a signal of the node nd21 to generate the storage data SD if the pulses (having a logic "high" level) of the oscillation signal OSC are inputted. Further, the logic levels of the signals may be different from or the opposite of those described. For example, a signal described as having a logic "high" level may alternatively have a logic "low" level, and a signal described as having a logic "low" level may alternatively have a logic "high" level.

The data generation circuit 213a having an aforementioned configuration may generate the storage data SD having a predetermined logic level in response to the pulses of the oscillation signal OSC while the start signal WSTR is enabled.

Figure 6:
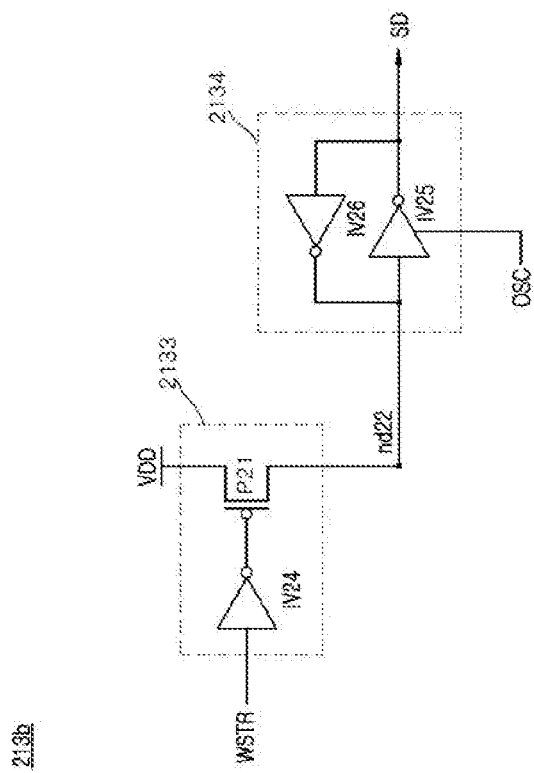
FIG. 6 is a circuit diagram illustrating a representation of an example of a configuration of another example of a data generation circuit included in the initialization operation control circuit of FIG. 4.

Referring to FIG. 6, a data generation circuit 213b corresponding to an example of the data generation circuit 213 of FIG. 4 may include a first driving circuit 2133 and a second latch circuit 2134.

The first driving circuit 2133 may be realized to include an inverter IV24 and a PMOS transistor P21 and may pull up a node nd22 to the power supply voltage VDD in response to the start signal WSTR. The first driving circuit 2133 may be coupled between a power supply voltage VDD terminal and the node nd22 to pull up the node nd22 to the power supply voltage VDD in response to the start signal WSTR. The first driving circuit 2133 may drive the node nd22 to have the power supply voltage VDD if the start signal WSTR has a logic "high" level. Further, the logic levels of the signals may be different from or the opposite of those described. For example, a signal described as having a logic "high" level may alternatively have a logic "low" level, and a signal described as having a logic "low" level may alternatively have a logic "high" level.

The second latch circuit 2134 may be realized using inverters IV25 and IV26 and may inversely buffer and latch a signal of the node nd22 to generate the storage data SD in response to the pulses of the oscillation signal OSC. That is, the second latch circuit 2134 may inversely buffer and latch a signal of the node nd22 to generate the storage data SD. The second latch circuit 2134 may be realized using a general latch circuit including the two inverters IV25 and IV26. The inverter IV25 may be realized using a tri-state inverter and may inversely buffer a signal of the node nd22 to generate the storage data SD if the pulses (having a logic "high" level) of the oscillation signal OSC are inputted.

The data generation circuit 213b having an aforementioned configuration may generate the storage data SD having a logic "low" level in response to the pulses of the oscillation signal OSC while the start signal WSTR is enabled. Further, the logic levels of the signals may be different from or the opposite of those described. For example, a signal described as having a logic "high" level may alternatively have a logic "low" level, and a signal described as having a logic "low" level may alternatively have a logic "high" level.

Figure 7:
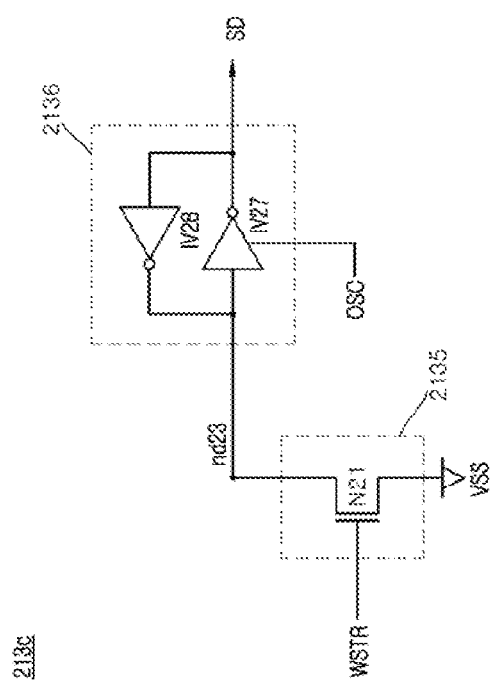
FIG. 7 is a circuit diagram illustrating a representation of an example of a configuration of an example of a data generation circuit included in the initialization operation control circuit of FIG. 4.

Referring to FIG. 7, a data generation circuit 213c corresponding to an example of the data generation circuit 213 of FIG. 4 may include a second driving circuit 2135 and a third latch circuit 2136.

The second driving circuit 2135 may be realized to include an NMOS transistor N21 and may pull down a node nd23 to the ground voltage VSS in response to the start signal WSTR. The second driving circuit 2135 may be coupled between the node nd23 and a ground voltage VSS terminal to pull up the node nd23 to the ground voltage VSS in response to the start signal WSTR. The second driving circuit 2135 may drive the node nd23 to have the ground voltage VSS if the start signal WSTR has a logic "high" level. Further, the logic levels of the signals may be different from or the opposite of those described. For example, a signal described as having a logic "high" level may alter- natively have a logic "low" level, and a signal described as having a logic "low" level may alternatively have a logic "high" level.

The third latch circuit 2136 may be realized using inverters IV27 and IV28 and may inversely buffer and latch a signal of the node nd23 to generate the storage data SD in response to the pulses of the oscillation signal OSC. That is, the third latch circuit 2136 may inversely buffer and latch a signal of the node nd23 to generate the storage data SD. The third latch circuit 2136 may be realized using a general latch circuit including the two inverters IV27 and IV28. The inverter IV27 may be realized using a tri-state inverter and may inversely buffer a signal of the node nd23 to generate the storage data SD if the pulses (having a logic "high" level) of the oscillation signal OSC are inputted. Further, the logic levels of the signals may be different from or the opposite of those described. For example, a signal described as having a logic "high" level may alternatively have a logic "low" level, and a signal described as having a logic "low" level may alternatively have a logic "high" level.

The data generation circuit 213c having an aforementioned configuration may generate the storage data SD having a logic "high" level in response to the pulses of the oscillation signal OSC while the start signal WSTR is enabled. Further, the logic levels of the signals may be different from or the opposite of those described. For example, a signal described as having a logic "high" level may alternatively have a logic "low" level, and a signal described as having a logic "low" level may alternatively have a logic "high" level.

Figure 8:
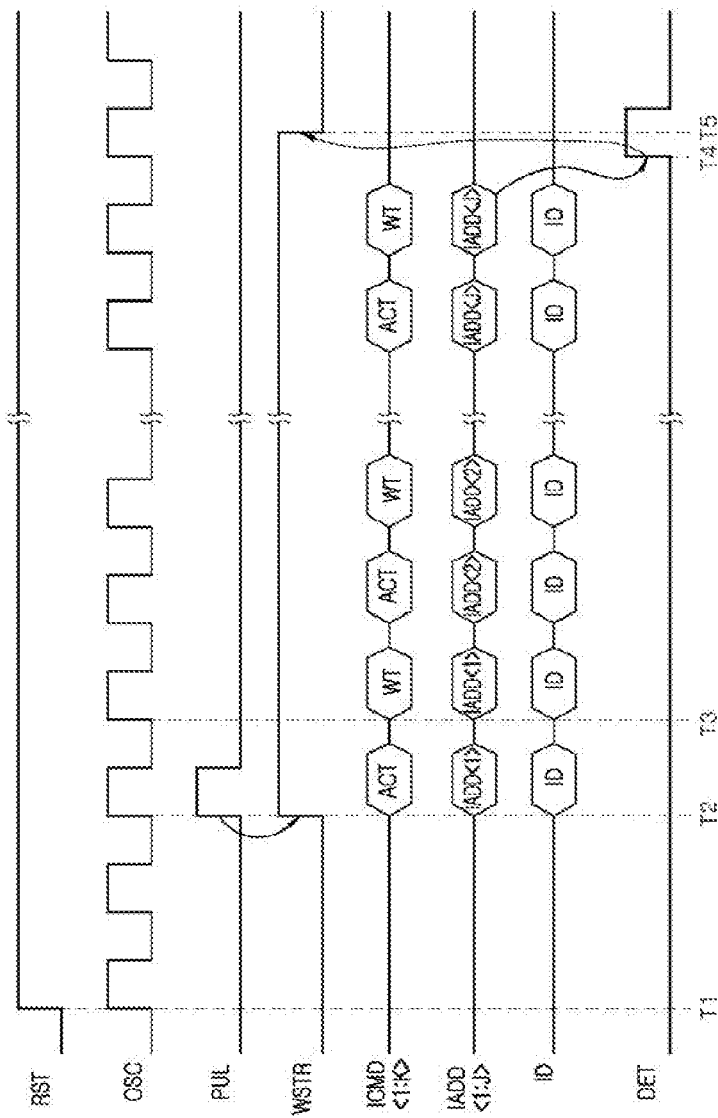
FIG. 8 is a timing diagram illustrating a representation of an example of an operation of a semiconductor system according to an embodiment.

The initialization operation of the semiconductor system having an aforementioned configuration will be described hereinafter with reference to FIG. 8 in conjunction with an operation of storing internal data having the same logic level into a plurality of memory cells.

At a point of time "T1", the first semiconductor device 1 may output the reset signal RST whose level is changed from a logic "low" level into a logic "high" level to perform the initialization operation of the second semiconductor device 2. In such a case, the first semiconductor device 1 may also output the first to $N^{th}$ command/address signals CA<1:N> and the data DQ.

The oscillator 11 may generate the oscillation signal OSC including pulses which are periodically created in response to the reset signal RST.

At a point of time "T2", the pulse signal generation circuit 121 may generate the pulse signal PUL including a pulse which is created after a predetermined period in response to the oscillation signal OSC. The predetermined period may be set to be a period from the point of time "T1" till a point of time (i.e., the point of time "T2") that a time corresponding to two cycles of the oscillation signal OSC elapses from the point of time "T1". The predetermined period means a boot-up operation period.

The start signal output circuit 122 may generate the start signal WSTR which is enabled to have a logic "high" level in response to the pulse of the pulse signal PUL.

The address generation circuit 211 may generate the first address ADD<1> of the first to $J^{th}$ addresses ADD<1:J> in response to the start signal WSTR having a logic "high" level and a pulse of the oscillation signal OSC.

The command generation circuit 212 may generate the first command CMD<1> of the first to $K^{th}$ commands CMD<1:K> in response to the start signal WSTR having a logic "high" level and a pulse of the oscillation signal OSC. In such a case, the first command CMD<1> may be set to be a command for performing an active operation ACT.

The data generation circuit 213 may generate the storage data SD having a logic "low" level in response to the start signal WSTR having a logic "high" level and a pulse of the oscillation signal OSC. In some embodiments, the data generation circuit 213 may be realized to generate the storage data SD having a logic "high" level.

The first transmission circuit 221 may output the first address ADD<1> as the first internal address IADD<1> in response to the start signal WSTR having a logic "high" level. In such a case, the first transmission circuit 221 may stop receiving the first to $J^{th}$ command/address signals CA<1:J> in response to the start signal WSTR having a logic "high" level.

The second transmission circuit 222 may output the first command CMD<1> as the first internal command ICMD<1> in response to the start signal WSTR having a logic "high" level. The first internal command ICMD<1> may correspond to a command for performing the active operation ACT. In such a case, the second transmission circuit 222 may stop receiving the $(J+1)^{th}$ to $N^{th}$ command/address signals CA<J+1:N> in response to the start signal WSTR having a logic "high" level.

The third transmission circuit 223 may output the storage data SD as the internal data ID in response to the start signal WSTR having a logic "high" level. In such a case, the third transmission circuit 223 may stop receiving the data DQ in response to the start signal WSTR having a logic "high" level.

The memory area 30 may activate a word line connected to the first memory cell among the plurality of memory cells, in response to the first internal command ICMD<1> for performing the active operation ACT and the first internal address IADD<1>.

At a point of time "T3", the address generation circuit 211 may generate the first address ADD<1> of the first to $J^{th}$ addresses ADD<1:J> in response to the start signal WSTR having a logic "high" level and a pulse of the oscillation signal OSC.

The command generation circuit 212 may generate the first command CMD<1> of the first to $K^{th}$ commands CMD<1:K> in response to the start signal WSTR having a logic "high" level and a pulse of the oscillation signal OSC. In such a case, the first command CMD<1> may be set to be a command for performing a write operation WT.

The data generation circuit 213 may generate the storage data SD having a logic "low" level in response to the start signal WSTR having a logic "high" level and a pulse of the oscillation signal OSC. In some embodiments, the data generation circuit 213 may be realized to generate the storage data SD having a logic "high" level.

The first transmission circuit 221 may output the first address ADD<1> as the first internal address IADD<1> in response to the start signal WSTR having a logic "high" level. In such a case, the first transmission circuit 221 may stop receiving the first to $J^{th}$ command/address signals CA<1:J> in response to the start signal WSTR having a logic "high" level.

The second transmission circuit 222 may output the first command CMD<1> as the first internal command ICMD<1> in response to the start signal WSTR having a logic "high" level. The first internal command ICMD<1> may correspond to a command for performing the write operation WT. In such a case, the second transmission circuit 222 may stop receiving the $(J+1)^{th}$ to $N^{th}$ command/address signals CA<J+1:N> in response to the start signal WSTR having a logic "high" level.

The third transmission circuit 223 may output the storage data SD as the internal data ID in response to the start signal WSTR having a logic "high" level. In such a case, the third transmission circuit 223 may stop receiving the data DQ in response to the start signal WSTR having a logic "high" level.

The memory area 30 may store the internal data ID in the first memory cell among the plurality of memory cells, in response to the first internal command ICMD<1> for performing the write operation WT and the first internal address IADD<1>.

After the point of time "T3", the second semiconductor device 2 may sequentially store the internal data ID in the plurality of memory cells according to the second to $K^{th}$ internal commands ICMD<2:K> and the second to $J^{th}$ internal addresses IADD<2:J>.

At a point of time "T4", The address sensing circuit 123 may generate the detection signal DET including a pulse which is created by the first to $J^{th}$ internal addresses IADD<1:J>, all bits of the which are counted.

At a point of time "T5", the start signal output circuit 122 may generate the start signal WSTR which is disabled to have a logic "low" level in response to the pulse of the detection signal DET.

After the point of time "T5", the second semiconductor device 2 may perform a normal operation in response to the first to $N^{th}$ command/address signals CA<1:N> and the data DQ which are outputted from the first semiconductor device 1.

The semiconductor system according to an aforementioned configuration may internally generate an oscillation signal and may generate internal commands, internal addresses and internal data in response to the oscillation signal to store the internal data having the same logic level into a plurality of memory cells of the semiconductor system, during an initialization operation. As a result, the plurality of memory cells of the semiconductor system may be initialized.

Referring to FIG. 9, a semiconductor device employed in a semiconductor system according to an embodiment may include a start signal generation circuit 40, an initialization operation control circuit 50, a first memory area 60, a second memory area 70, a third memory area 80 and a fourth memory area 90.

The start signal generation circuit 40 may generate an oscillation signal OSC including pulses which are periodically created in response to a reset signal RST and may also generate a start signal WSTR which is enabled in response to the reset signal RST. The start signal generation circuit 40 may generate the oscillation signal OSC including the pulses which are periodically created if the reset signal RST is enabled for execution of an initialization operation. The start signal generation circuit 40 may generate the start signal WSTR which is enabled from a point of time that a level of the reset signal RST is changed to perform the initialization operation till a point of time that all of bits of first to $J^{th}$ internal addresses IADD<1:J> are counted. The start signal generation circuit 40 may be realized to have the same configuration as the start signal generation circuit 10 described with reference to FIG. 2 to perform the same operation as the start signal generation circuit 10. Thus, a description of the start signal generation circuit 40 will be omitted hereinafter.

The initialization operation control circuit 50 may generate first to $J^{th}$ internal addresses IADD<1:J>, first to $K^{th}$ internal commands ICMD<1:K> and internal data ID for the initialization operation in response to the oscillation signal OSC and the start signal WSTR. The initialization operation control circuit 50 may generate the first to $J^{th}$ internal addresses IADD<1:J> and the first to $K^{th}$ internal commands ICMD<1:K> which are sequentially counted in response to the pulses of the oscillation signal OSC while the start signal WSTR is enabled. The initialization operation control circuit 50 may generate the internal data ID having predetermined logic levels in response to the pulses of the oscillation signal OSC while the start signal WSTR is enabled. The initialization operation control circuit 50 may stop receiving first to $N^{th}$ command/address signals CA<1:N> and data DQ while the start signal WSTR is enabled. The initialization operation control circuit 50 may output the data DQ as the internal data ID in synchronization with a strobe signal DQS after the initialization operation. The initialization operation control circuit 50 may be realized to have the same configuration as the initialization operation control circuit 20 described with reference to FIG. 4 to perform the same operation as the initialization operation control circuit 20. Thus, a description of the initialization operation control circuit 50 will be omitted hereinafter.

Each of the first to fourth memory areas 60, 70, 80 and 90 may include a plurality of memory cells and may store the internal data ID into the memory cells selected by the first to $J^{th}$ internal addresses IADD<1:J> in response to the first to $K^{th}$ internal commands ICMD<1:K>. Each of the first to fourth memory areas 60, 70, 80 and 90 may be realized to include a nonvolatile memory device or a volatile memory device according to the embodiments. The internal data ID stored in the memory cells during the initialization operation may have the same logic level. In such a case, the logic level of the internal data ID may be set to a logic "high" level or a logic "low" level according to the embodiments.

The semiconductor system according to an embodiment may internally generate an oscillation signal and may generate internal commands, internal addresses and internal data in response to the oscillation signal to store the internal data having the same logic level into a plurality of memory areas of the semiconductor system, during an initialization operation. As a result, the plurality of memory areas of the semiconductor system may be initialized.

Figure 10:
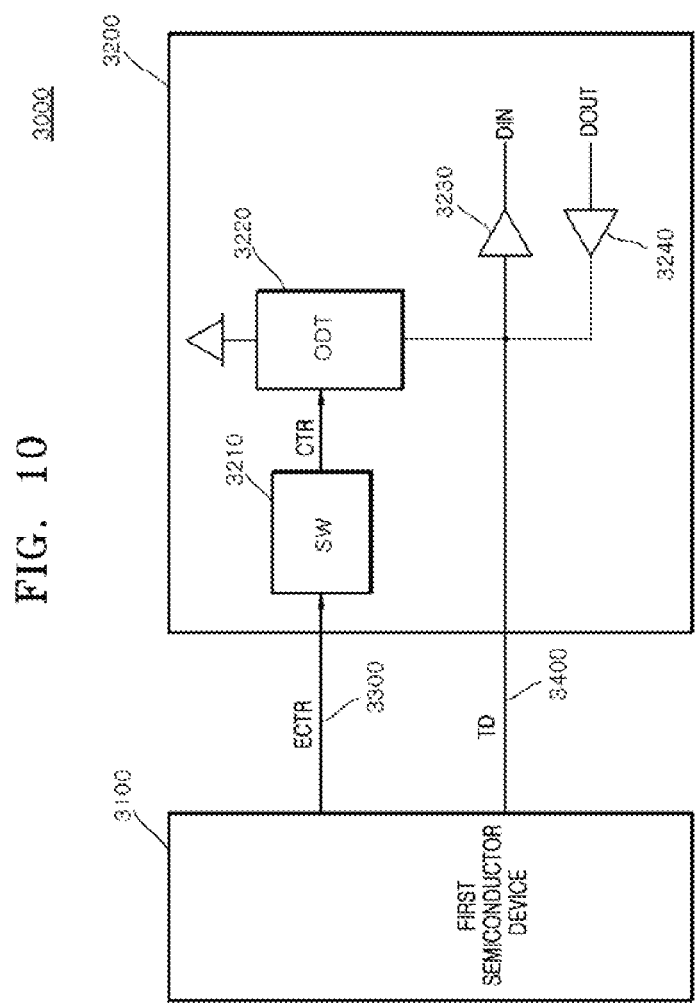
FIG. 10 is a block diagram illustrating a representation of an example of a configuration of another electronic system employing the semiconductor device or the semiconductor system illustrated in FIGS. 1 to 9.

The semiconductor devices or the semiconductor systems described with reference to FIGS. 1 to 9 may be applied to an electronic system that includes a memory system, a graphic system, a computing system, a mobile system, or the like. For example, as illustrated in FIG. 10, an electronic system 3000 according an embodiment may include a first semiconductor device 3100 and a second semiconductor device 3200.

The first semiconductor device 3100 may apply an external control signal ECTR for controlling an ODT circuit 3220 included in the second semiconductor device 3200 to the second semiconductor device 3200 through a signal line 3300. The first semiconductor device 3100 may not apply the external control signal ECTR to the second semiconductor device 3200 during an initialization operation of the second semiconductor device 3200. The first semiconductor device 3100 may apply transmission data TD to the second semiconductor device 3200.

The second semiconductor device 3200 may include a switch (SW) 3210, the ODT circuit 3220, an input buffer 3230 and an output buffer 3240. The switch (SW) 3210 may receive the external control signal ECTR and may output the external control signal ECTR as a control signal CTR. The ODT circuit 3220 may be turned on in response to the control signal CTR. The ODT circuit 3220 may be turned off during the initialization operation of the second semiconductor device 3200. The input buffer 3230 may receive the transmission data TD, through a signal line 3400, to generate input data DIN during a write operation. The input data DIN may store in memory cells (not illustrated) included in the second semiconductor device 3200 during the write operation. The output buffer 3240 may receive output data DOUT and may output the output data DOUT as the transmission data TD, through the signal line 3400, during a read operation. The output data DOUT may be outputted from the memory cells (not illustrated) included in the second semiconductor device 3200 during the read operation.

Figure 11:
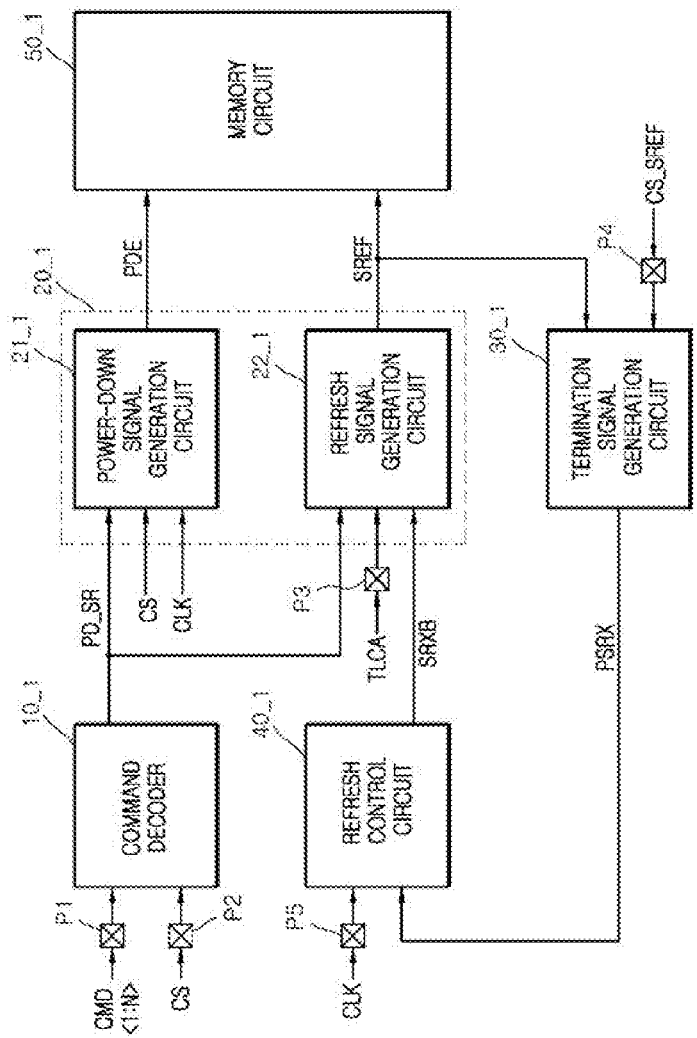
FIG. 11 is a block diagram illustrating an example of a representation of a configuration of a semiconductor device according to an embodiment.

Referring to FIG. 11, a semiconductor device according to an embodiment may include a command decoder 10_1, an operation signal generation circuit 20_1, a termination signal generation circuit 30_1, a refresh control circuit 40_1 and a memory circuit 50_1.

The command decoder 10_1 may decode commands CMD<1:N> to generate a multi-operation signal PD_SR in response to a chip selection signal CS. The commands CMD<1:N> may be inputted to the command decoder 10_1 through a pad P1. The commands CMD<1:N> may be transmitted from an external device such as a chip set device controlling the semiconductor device to the command decoder 10_1. The commands CMD<1:N> may be successively inputted to the command decoder 10_1 through a single line that transmits commands, addresses and data. The chip selection signal CS may be inputted to the command decoder 10_1 through a pad P2. The number "N" of bits of the commands CMD<1:N> may be set to be a natural number and may be set to be different according to the embodiments.

The operation signal generation circuit 20_1 may include a power-down signal generation circuit 21_1 and a refresh signal generation circuit 22_1.

The power-down signal generation circuit 21_1 may generate a power-down signal PDE in response to the multi-operation signal PD_SR. The power-down signal generation circuit 21_1 may generate the power-down signal PDE which is enabled if the multi-operation signal PD_SR is enabled. The power-down signal generation circuit 21_1 may generate the power-down signal PDE which is enabled during a power-down operation period from a point of time that the multi-operation signal PD_SR is enabled. The power-down signal generation circuit 21_1 may generate the power-down signal PDE which is enabled from a point of time that the multi-operation signal PD_SR is enabled till a point of time that the chip selection signal CS is delayed by a first set period in synchronization with a clock signal CLK. In some embodiments, the power-down signal PDE may be enabled after the multi-operation signal PD_SR is enabled. The power-down operation period may be set to correspond to a period in which the chip selection signal CS is delayed by the first set period in synchronization with a clock signal CLK. That is, the power-down operation period may correspond to the first set period.

The refresh signal generation circuit 22_1 may generate a refresh signal SREF which is enabled during a refresh operation period in response to the multi-operation signal PD_SR and an operation selection signal TLCA. The refresh signal generation circuit 22_1 may generate the refresh signal SREF which is enabled if the multi-operation signal PD_SR is enabled and the operation selection signal TLCA is inputted. The refresh signal generation circuit 22_1 may generate the refresh signal SREF which is enabled during a second set period from a point of time that the multi-operation signal PD_SR is enabled and the operation selection signal TLCA is inputted. The refresh signal generation circuit 22_1 may generate the refresh signal SREF which is enabled during the refresh operation period from a point of time that the multi-operation signal PD_SR is enabled and the operation selection signal TLCA is inputted. The operation selection signal TLCA may be inputted through a pad P3 to which the commands CMD<1:N> are applied and may be a signal for performing a refresh operation. In some embodiments, the refresh signal SREF may be enabled after the multi-operation signal PD_SR is enabled. The refresh operation period may be set to correspond to the second set period in which refresh operations of all of memory cells included in the memory circuit 50_1 are performed.

As described above, the operation signal generation circuit 20_1 may generate the power-down signal PDE which is enabled during the power-down operation period and the refresh signal SREF which is enabled during the refresh operation period, in response to the multi-operation signal PD_SR and the operation selection signal TLCA.

The termination signal generation circuit 30_1 may generate a termination signal PSRX which is enabled in response to the refresh signal SREF and a refresh control signal CS_SREF. The termination signal generation circuit 30_1 may generate the termination signal PSRX which is disabled in response to the refresh signal SREF and may generate the termination signal PSRX which is enabled in response to the refresh control signal CS_SREF. The refresh control signal CS_SREF may be inputted to the termination signal generation circuit 30_1 through a pad P4.

The refresh control circuit 40_1 may generate a refresh termination signal SRXB which is enabled in response to the clock signal CLK and the termination signal PSRX. The refresh control circuit 40_1 may generate the refresh termination signal SRXB which is enabled if the termination signal PSRX is inputted in synchronization with the clock signal CLK. The clock signal CLK may be inputted to the refresh control circuit 40_1 through a pad P5.

The memory circuit 50_1 may perform a power-down operation and a refresh operation in response to the power-down signal PDE and the refresh signal SREF. The memory circuit 50_1 may perform the power-down operation if the power-down signal PDE is enabled. The memory circuit 50_1 may perform the refresh operation if the refresh signal SREF is enabled. During the power-down operation, the semiconductor device may stop performing an input/output (I/O) operation of data and generating internal voltages for driving internal circuits of the semiconductor devices. The refresh operation may correspond to an operation for rewriting data stored in memory cells into the memory cells within a data retention time. The refresh operation may be set to a self-refresh operation, an auto-refresh operation or the like according to the embodiments.

Various combinations of the commands CMD<1:N> for the power-down operation of the semiconductor device will be described hereinafter with reference to FIG. 12 in conjunction with an example in which the commands CMD<1:N> are set to have five bits.

A combination of the commands CMD<1:5> for power-down operation entry may be set to include a first command<1> having a logic "high" level, a second command<2> having a logic "low" level, a third command<3> having a logic "high" level, a fourth command<4> having a logic "high" level, and a fifth command<5> having a logic "high" level. In addition, the operation selection signal TLCA for the power-down operation entry may be set to have a logic "low" level.

A combination of the commands CMD<1:5> for power-down operation exit may be set to include a first command<1> having a logic "high" level, a second command<2> having a logic "high" level, a third command<3> having a logic "high" level, a fourth command<4> having a logic "high" level, and a fifth command<5> having a logic "high" level. In addition, the operation selection signal TLCA for the power-down operation exit may be set to have a logic "low" level.

The combinations of the commands <1:5> illustrated in FIG. 12 are merely examples of suitable combinations for the power-down operation. Accordingly, in some embodiments, any other combinations of the commands <1:5> may be used to perform and terminate the power-down operation.

Various combinations of the commands CMD<1:N> for the refresh operation of the semiconductor device will be described hereinafter with reference to FIG. 13 in conjunction with an example in which the commands CMD<1:N> are set to have five bits.

A combination of the commands CMD<1:5> for refresh operation entry may be set to include a first command<1> having a logic "high" level, a second command<2> having a logic "low" level, a third command<3> having a logic "high" level, a fourth command<4> having a logic "high" level, and a fifth command<5> having a logic "high" level. In addition, the operation selection signal TLCA for the refresh operation entry may be set to have a logic "high" level.

A combination of the commands CMD<1:5> for refresh operation exit may be set to include a first command<1> having a logic "high" level, a second command<2> having a logic "high" level, a third command<3> having a logic "high" level, a fourth to command<4> having a logic "high" level, and a fifth command<5> having a logic "high" level. In addition, the operation selection signal TLCA for the refresh operation exit may be set to have a logic "high" level.

The combinations of the commands <1:5> illustrated in FIG. 13 are merely examples of suitable combinations for the refresh operation. Accordingly, in some embodiments, any other combinations of the commands <1:5> may be used to perform and terminate the refresh operation.

Figure 14:
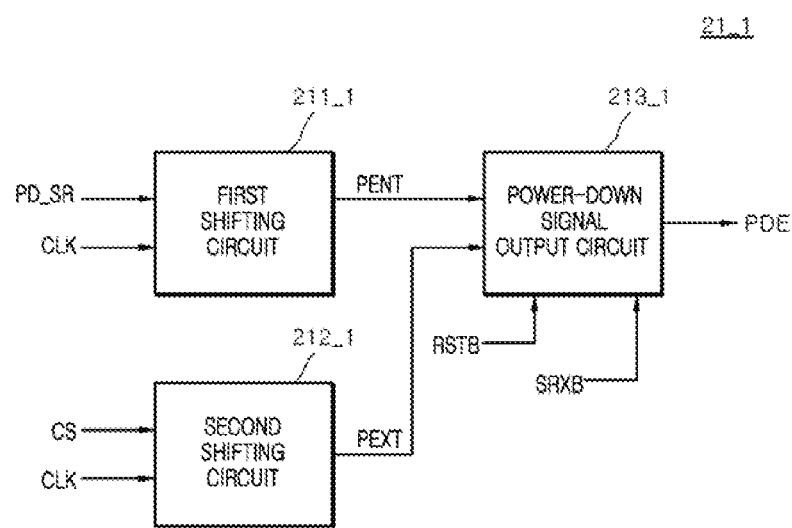
FIG. 14 is a block diagram illustrating an example of a representation of a configuration of a power-down signal generation circuit included in a semiconductor device of FIG. 11.

Referring to FIG. 14, the power-down signal generation circuit 21_1 may include a first shifting circuit 211_1, a second shifting circuit 212_1 and a power-down signal output circuit 213_1.

The first shifting circuit 211_1 may shift the multi-operation signal PD_SR to generate a power-down entry signal PENT in synchronization with the clock signal CLK. The first shifting circuit 211_1 may shift the multi-operation signal PD_SR by a predetermined number of cycle times of the clock signal CLK to generate the power-down entry signal PENT. The predetermined number of cycle times of the clock signal CLK for shifting the multi-operation signal PD_SR may be set to be different according to the embodiments. The first shifting circuit 211_1 may be realized using a general shift register that shifts an input signal (i.e., the multi-operation signal PD_SR) in synchronization with the clock signal CLK.

The second shifting circuit 212_1 may shift the chip selection signal CS to generate a power-down exit signal PEXT in synchronization with the clock signal CLK. The second shifting circuit 212_1 may shift the chip selection signal CS by a predetermined number of cycle times of the clock signal CLK to generate the power-down exit signal PEXT. The predetermined number of cycle times of the clock signal CLK for shifting the chip selection signal CS may be set to be different according to the embodiments. The predetermined number of cycle times of the clock signal CLK for shifting the chip selection signal CS may be set to correspond to the power-down operation period. The second shifting circuit 212_1 may be realized using a general shift register that shifts an input signal (i.e., the chip selection signal CS) in synchronization with the clock signal CLK.

The power-down signal output circuit 213_1 may generate the power-down signal PDE in response to the power-down entry signal PENT and the power-down exit signal PEXT. The power-down signal output circuit 213_1 may generate the power-down signal PDE which is enabled if the power-down entry signal PENT is enabled. The power-down signal output circuit 213_1 may generate the power-down signal PDE which is disabled if the power-down exit signal PEXT is enabled. The power-down signal output circuit 213_1 may generate the power-down signal PDE which is enabled in response to a reset signal RSTB which is enabled while the semiconductor device performs an initialization operation. The power-down signal output circuit 213_1 may generate the power-down signal PDE which is enabled if the refresh termination signal SRXB is disabled.

Figure 15:
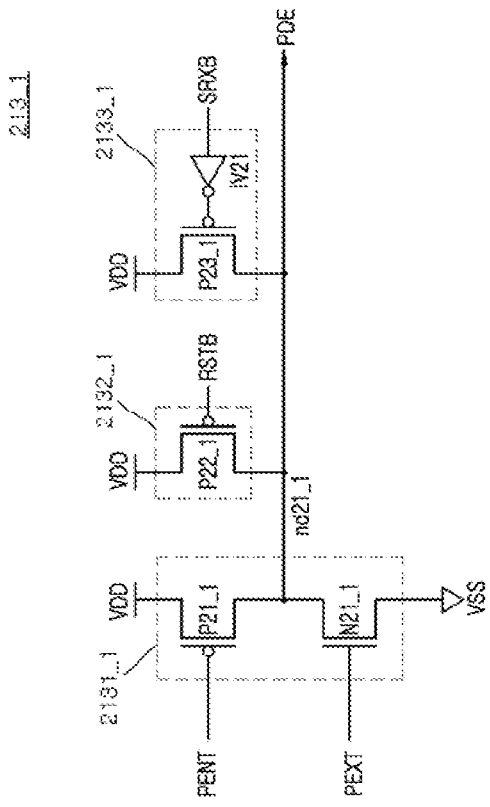
FIG. 15 is a circuit diagram illustrating an example of a representation of a power-down signal output circuit included in a power-down signal generation circuit of FIG. 14.

Referring to FIG. 15, the power-down signal output circuit 213_1 may include a first driving circuit 2131_1, a second driving circuit 2132_1 and a third driving circuit 2133_1.

The first driving circuit 2131_1 may be realized to include a PMOS transistor P21_1 and an NMOS transistor N21_1 which are connected in series. The PMOS transistor P21_1 may be coupled between a power supply voltage VDD terminal and a first node nd21_1 and may be turned on in response to the power-down entry signal PENT. The NMOS transistor N21_1 may be coupled between the first node nd21_1 and a ground voltage VSS terminal and may be turned on in response to the power-down exit signal PEXT. The first driving circuit 2131_1 may drive the first node nd21_1 to generate the power-down signal PDE, in response to the power-down entry signal PENT and the power-down exit signal PEXT. The first driving circuit 2131_1 may pull up the first node nd21_1 to generate the power-down signal PDE which is enabled to have a logic "high" level, if the power-down entry signal PENT is enabled to have a logic "low" level. The first driving circuit 2131_1 may pull down the first node nd21_1 to generate the power-down signal PDE which is disabled to have a logic "low" level, if the power-down exit signal PEXT is enabled to have a logic "high" level.

The second driving circuit 2132_1 may be realized using a PMOS transistor P22_1 which is coupled between the power supply voltage VDD terminal and the first node nd21_1. The PMOS transistor P22_1 may be turned on in response to the reset signal RSTB. The second driving circuit 2132_1 may generate the power-down signal PDE which is enabled in response to the reset signal RSTB. The second driving circuit 2132_1 may pull up the first node nd21_1 to generate the power-down signal PDE which is enabled to have a logic "high" level, if the reset signal RSTB is enabled to have a logic "low" level.

The third driving circuit 2133_1 may be realized to include an inverter IV21_1 and a PMOS transistor P23_1. The inverter IV21_1 may inversely buffer the refresh termination signal SRXB. The PMOS transistor P23_1 may be coupled between the power supply voltage VDD terminal and the first node nd21_1 and may be turned on in response to an output signal of the inverter IV21_1. The third driving circuit 2133_1 may generate the power-down signal PDE which is enabled in response to the refresh termination signal SRXB. The third driving circuit 2133_1 may pull up the first node nd21_1 to generate the power-down signal PDE which is enabled to have a logic "high" level, if the refresh termination signal SRXB is disabled to have a logic "high" level.

As described above, the power-down signal output circuit 213_1 may generate the power-down signal PDE in response to the power-down entry signal PENT and the power-down exit signal PEXT. The power-down signal output circuit 213_1 may generate the power-down signal PDE which is enabled in response to the reset signal RSTB during the initialization operation of the semiconductor device. The power-down signal output circuit 213_1 may generate the power-down signal PDE which is enabled in response to the refresh termination signal SRXB during the refresh operation.

A power-down operation of the semiconductor device according to an embodiment will be described hereinafter with reference to FIG. 16.

At a point of time "T11", the command decoder 10_1 may decode the first command CMD<1> having a logic "high" level, the second command CMD<2> having a logic "low" level, the third command CMD<3> having a logic "high" level, the fourth command CMD<4> having a logic "high" level, and the fifth command CMD<5> having a logic "high" level constituting the commands CMD<1:N> for entering the power-down operation to generate the multi-operation signal PD_SR having a logic "high" level, in response to the chip selection signal CS having a logic "low" level. The first to fifth commands CMD<1:5> may be inputted to the command decoder 10_1 in synchronization with a rising edge of the clock signal CLK. Meanwhile, the operation selection signal TLCA having a logic "low" level (i.e., L) may be inputted to the command decoder 10_1 so that the semiconductor device does not enter the refresh operation.

After the point of time "T11", a combination of the commands CMD<1:5> may change so that all of the first to fifth commands CMD<1>, CMD<2>, CMD<3>, CMD<4> and CMD<5> have a logic "high" level.

At a point of time "T12", the power-down signal generation circuit 21_1 may generate the power-down signal PDE which is enabled to have a logic "high" level in response to the chip selection signal CS having a logic "low" level at the point of time "T11" and the multi-operation signal PD_SR having a logic "high" level at the point of time "T11", in synchronization with a rising edge of the clock signal CLK.

The memory circuit 50_1 may perform the power-down operation in response to the power-down signal PDE having a logic "high" level.

At a point of time "T13", the command decoder 10_1 may decode the first command CMD<1> having a logic "high" level, the second command CMD<2> having a logic "high" level, the third command CMD<3> having a logic "high" level, the fourth command CMD<4> having a logic "high" level, and the fifth command CMD<5> having a logic "high" level constituting the commands CMD<1:N> for terminating the power-down operation to generate the multi-operation signal PD_SR having a logic "low" level, in response to the chip selection signal CS whose level is changed from a logic "high" level into a logic "low" level.

The power-down signal generation circuit 21_1 may generate the power-down signal PDE having a logic "low" level because the chip selection signal CS having a logic "low" level is inputted after the first set period from the point of time "T11" that the multi-operation signal PD_SR is enabled. The power-down operation period may correspond to the first set period.

The memory circuit 50_1 may terminate the power-down operation in response to the power-down signal PDE having a logic "low" level.

Figure 16:
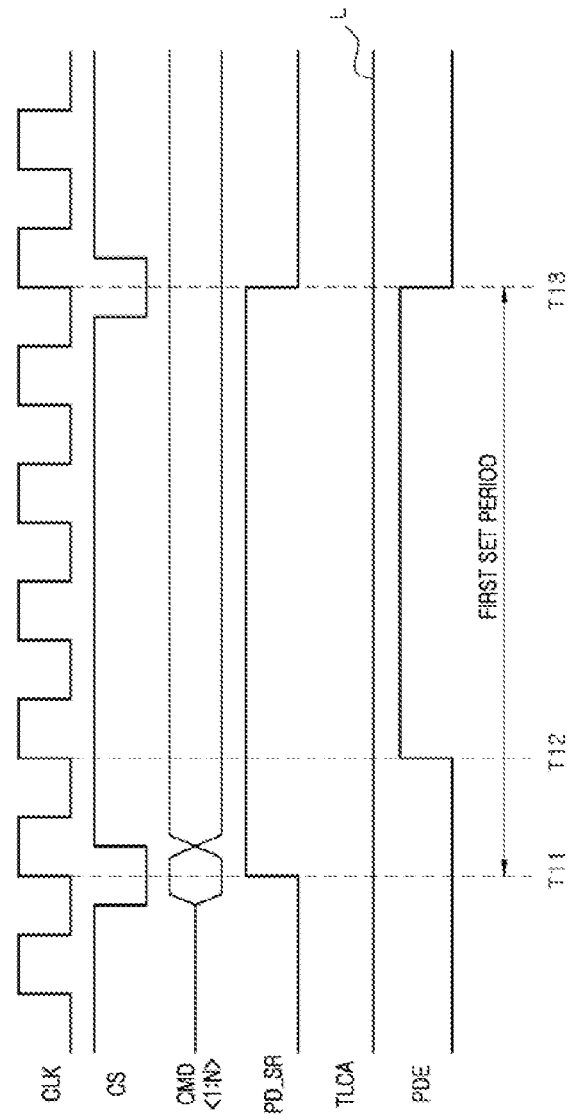
FIG. 16 is a timing diagram illustrating a power-down operation of a semiconductor device according to an embodiment.

The timing diagram illustrated in FIG. 16 is merely an example of suitable timing diagrams for the power-down operation. Accordingly, in some embodiments, any other timing diagrams may be used to perform and terminate the power-down operation.

Figure 17:
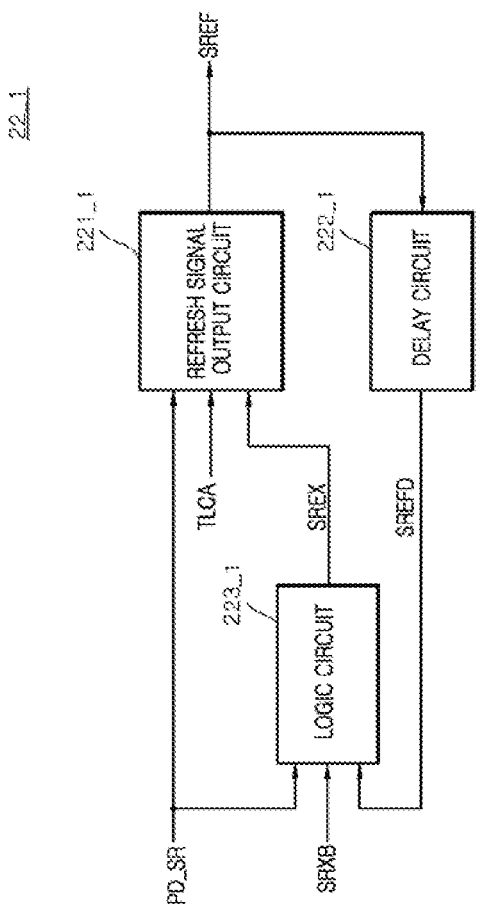
FIG. 17 is a block diagram illustrating an example of a representation of a configuration of a refresh signal generation circuit included in a semiconductor device of FIG. 11.

Referring to FIG. 17, the refresh signal generation circuit 22_1 may include a refresh signal output circuit 221_1, a delay circuit 222_1 and a logic circuit 223_1.

The refresh signal output circuit 221_1 may generate the refresh signal SREF which is enabled in response to the multi-operation signal PD_SR and the operation selection signal TLCA. The refresh signal output circuit 221_1 may generate the refresh signal SREF which is disabled in response to a refresh exit signal SREX. The refresh signal output circuit 221_1 may generate the refresh signal SREF which is enabled if the multi-operation signal PD_SR and the operation selection signal TLCA are enabled. The refresh signal output circuit 221_1 may generate the refresh signal SREF which is disabled if the refresh exit signal SREX is enabled. The refresh signal output circuit 221_1 may generate the refresh signal SREF which is enabled from a point of time that the multi-operation signal PD_SR and the operation selection signal TLCA are enabled till a point of time that the refresh exit signal SREX is enabled.

The delay circuit 222_1 may delay the refresh signal SREF by the second set period to generate a refresh delay signal SREFD. The delay circuit 222_1 may invert and delay the refresh signal SREF by the second set period to generate the refresh delay signal SREFD. The delay circuit 222_1 may be realized using a general delay circuit comprised of a plurality of inverters which are connected in series.

The logic circuit 223_1 may generate the refresh exit signal SREX in response to the multi-operation signal PD_SR, the refresh termination signal SRXB and the refresh delay signal SREFD. The logic circuit 223_1 may generate the refresh exit signal SREX which is disabled if the multi-operation signal PD_SR is enabled. The logic circuit 223_1 may generate the refresh exit signal SREX which is disabled if the refresh termination signal SRXB is disabled. The logic circuit 223_1 may generate the refresh exit signal SREX which is disabled if the refresh delay signal SREFD is disabled. The logic circuit 223_1 may execute a NOR operation of the multi-operation signal PD_SR, the refresh termination signal SRXB and the refresh delay signal SREFD to generate the refresh exit signal SREX. The logic circuit may be comprised of a logic circuit 223_1 or circuits to implement the NOR operation. For example, the logic circuit 223_1 may be realized with a NOR gate or equivalent circuits for performing a NOR operation.

As described above, the refresh signal generation circuit 22_1 may generate the refresh signal SREF which is enabled during the refresh operation period in response to the multi-operation signal PD_SR and the operation selection signal TLCA.

Figure 18:
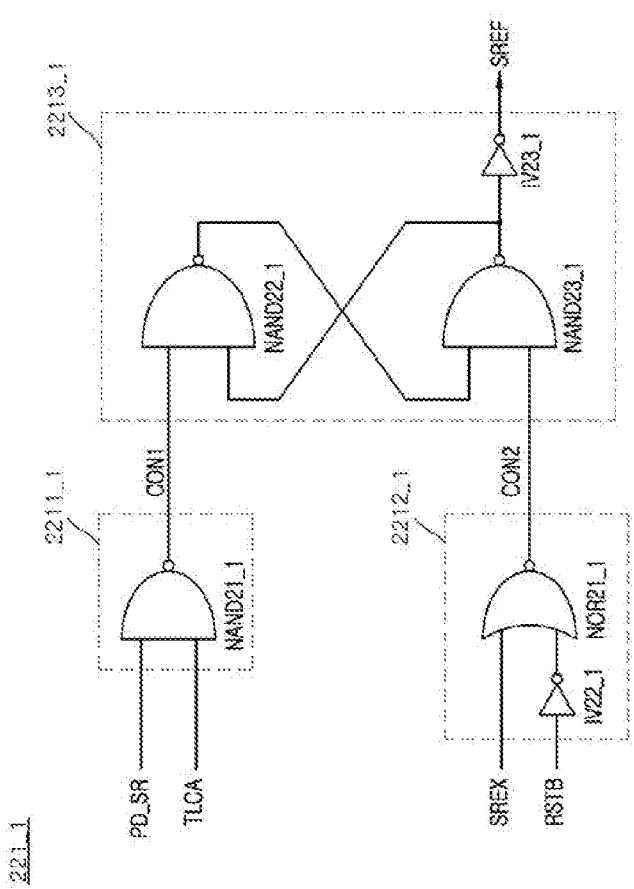
FIG. 18 is a circuit diagram illustrating an example of a representation of a refresh signal output circuit included in a refresh signal generation circuit of FIG. 17.

Referring to FIG. 18, the refresh signal output circuit 221_1 may include a first control signal generation circuit 2211_1, a second control signal generation circuit 2212_1 and a latch circuit 2213_1.

The first control signal generation circuit 2211_1 may be realized using a NAND gate NAND21_1 and may be configured to generate a first control signal CON1 in response to the multi-operation signal PD_SR and the operation selection signal TLCA. The first control signal generation circuit 2211_1 may execute a NAND operation of the multi-operation signal PD_SR and the operation selection signal TLCA to generate the first control signal CON1. The first control signal generation circuit 2211_1 may generate the first control signal CON1 which is enabled to have a logic "low" level if both of the multi-operation signal PD_SR and the operation selection signal TLCA are enabled to have a logic "high" level.

The second control signal generation circuit 2212_1 may be realized to include an inverter IV22_1 and a NOR gate NOR21_1 and may be configured to generate a second control signal CON2 in response to the reset signal RSTB or the refresh exit signal SREX. The second control signal generation circuit 2212_1 may generate the second control signal CON2 which is enabled to have a logic "low" level if the reset signal RSTB is enabled to have a logic "low" level. The second control signal generation circuit 2212_1 may generate the second control signal CON2 which is enabled to have a logic "low" level if the refresh exit signal SREX is enabled to have a logic "high" level.

The latch circuit 2213_1 may be realized to include NAND gates NAND22_1 and NAND23_1 and an inverter IV23_1 and may be configured to generate the refresh signal SREF which is enabled in response to the first control signal CON1 and which is disabled in response to the second control signal CON2. The latch circuit 2213_1 may generate the refresh signal SREF which is enabled to have a logic "high" level if the first control signal CON1 is enabled to have a logic "low" level. The latch circuit 2213_1 may generate the refresh signal SREF which is disabled to have a logic "low" level if the second control signal CON2 is enabled to have a logic "low" level. The latch circuit 2213_1 may generate the refresh signal SREF which is enabled to have a logic "high" level from a point of time that the first control signal CON1 is enabled to have a logic "low" level till a point of time that the second control signal CON2 is enabled to have a logic "low" level.

As described above, the refresh signal output circuit 221_1 may generate the refresh signal SREF which is enabled in response to the multi-operation signal PD_SR and the operation selection signal TLCA and which is disabled in response to the reset signal RSTB or the refresh exit signal SREX.

Figure 19:
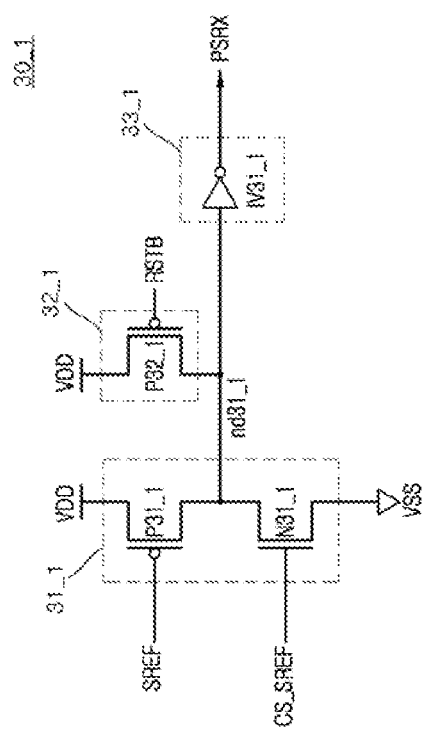
FIG. 19 is a circuit diagram illustrating an example of a representation of a termination signal generation circuit included in a semiconductor device of FIG. 11.

Referring to FIG. 19, the termination signal generation circuit 30_1 may include a fourth driving circuit 31_1, a fifth driving circuit 32_1 and a buffer circuit 33_1.

The fourth driving circuit 31_1 may be realized to include a PMOS transistor P31_1 and an NMOS transistor N31_1 which are connected in series. The PMOS transistor P31_1 may be coupled between the power supply voltage VDD terminal and a second node nd31_1 and may be turned on in response to the refresh signal SREF. The NMOS transistor N31_1 may be coupled between the second node nd31_1 and the ground voltage VSS terminal and may be turned on in response to the refresh control signal CS_SREF. The fourth driving circuit 31_1 may drive the second node nd31_1 in response to the refresh signal SREF and the refresh control signal CS_SREF. The fourth driving circuit 31_1 may pull up the second node nd31_1 if the refresh signal SREF is disabled to have a logic "low" level. The fourth driving circuit 31_1 may pull down the second node nd31_1 if the refresh control signal CS_SREF is enabled to have a logic "high" level.

The fifth driving circuit 32_1 may be realized using a PMOS transistor P32_1 which is coupled between the power supply voltage VDD terminal and the second node nd31_1. The PMOS transistor P32_1 may be turned on in response to the reset signal RSTB. The fifth driving circuit 32_1 may pull up the second node nd31_1 in response to the reset signal RSTB.

The buffer circuit 33_1 may be realized using an inverter IV31_1 and may be configured to inversely buffer a signal of the second node nd31_1 to generate the termination signal PSRX.

As described above, the termination signal generation circuit 30_1 may generate the termination signal PSRX which is disabled before the refresh operation and during the initialization operation and which is enabled if the refresh control signal CS_SREF is inputted.

The refresh operation of the semiconductor device according to an embodiment will be described hereinafter with reference to FIG. 20.

At a point of time "T21", the command decoder 10_1 may decode the first command CMD<1> having a logic "high" level, the second command CMD<2> having a logic "low" level, the third command CMD<3> having a logic "high" level, the fourth command CMD<4> having a logic "high" level, and the fifth command CMD<5> having a logic "high" level constituting the commands CMD<1:N> for entering the refresh operation to generate the multi-operation signal PD_SR having a logic "high" level, in response to the chip selection signal CS having a logic "low" level. The first to fifth commands CMD<1:5> may be inputted to the command decoder 10_1 in synchronization with a rising edge of the clock signal CLK. Meanwhile, the operation selection signal TLCA having a logic "high" level may be inputted to the command decoder 10_1 so that the semiconductor device enters the refresh operation.

After the point of time "T21", a combination of the commands CMD<1:5> may change so that all of the first to fifth commands CMD<1>, CMD<2>, CMD<3>, CMD<4> and CMD<5> have a logic "high" level.

At a point of time "T22", the refresh signal generation circuit 22_1 may generate the refresh signal SREF which is enabled to have a logic "high" level in response to the operation selection signal TLCA having a logic "high" level at the point of time "T21" and the multi-operation signal PD_SR having a logic "high" level at the point of time "T21". The clock signal CLK is not toggled if the refresh signal SREF for the refresh operation is enabled.

The memory circuit 50_1 may perform the refresh operation in response to the refresh signal SREF having a logic "high" level.

At a point of time "T23", a level of the chip selection signal CS may be changed from a logic "high" level into a logic "low" level to terminate the refresh operation. The chip selection signal CS may maintain a logic "low" level from the point of time "T23". A period in which the chip selection signal CS maintains a logic "low" level may correspond to a period for terminating the refresh operation. If a level of the chip selection signal CS is changed from a logic "high" level into a logic "low" level at the point of time "T23", the clock signal CLK may be toggled. Although FIG. 20 illustrates an example in which the period having a logic "low" level of the chip selection signal CS to terminate the refresh operation corresponds to a single cycle time of the clock signal CLK, the present disclosure is not limited thereto. That is, the period having a logic "low" level of the chip selection signal CS to terminate the refresh operation may be set to be different according to the embodiments. The period having a logic "low" level of the chip selection signal CS to terminate the refresh operation may be set to provide a stable toggle of the clock signal CLK.

At a point of time "T24", the command decoder 10_1 may decode the first command CMD<1> having a logic "high" level, the second command CMD<2> having a logic "high" level, the third command CMD<3> having a logic "high" level, the fourth command CMD<4> having a logic "high" level, and the fifth command CMD<5> having a logic "high" level constituting the commands CMD<1:N> for terminating the refresh operation to generate the multi-operation signal PD_SR having a logic "low" level, in response to the chip selection signal CS whose level is changed from a logic "high" level into a logic "low" level at the point of time "T23".

The refresh signal generation circuit 22_1 may generate the refresh signal SREF having a logic "low" level after the second set period corresponding to the refresh operation period from the point of time "T21" that the multi-operation signal PD_SR is enabled. The refresh operation period may be set to correspond to the second set period.

The memory circuit 50_1 may terminate the refresh operation in response to the refresh signal SREF having a logic "low" level.

Figure 20:
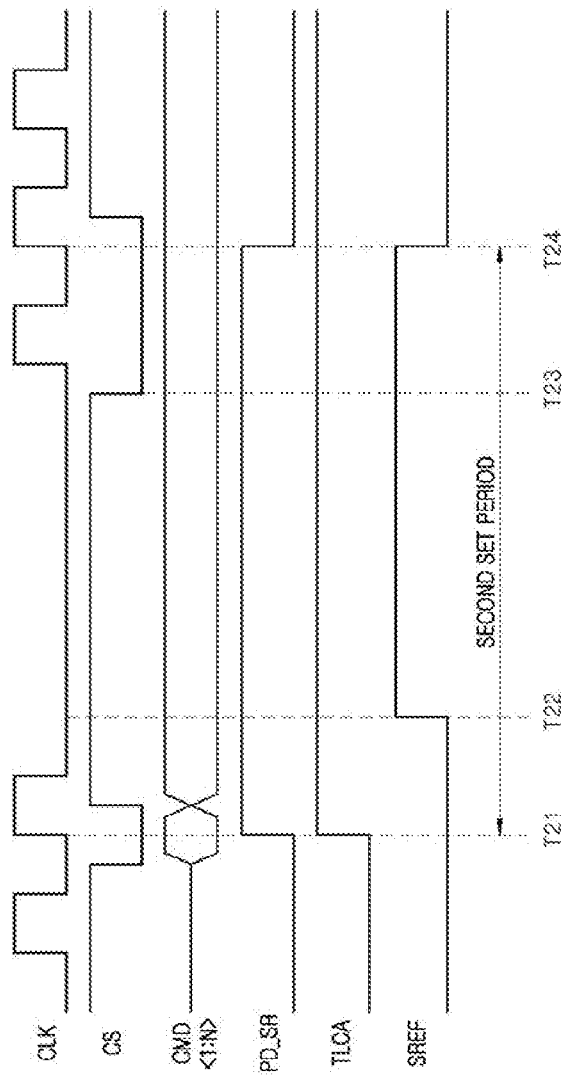
FIG. 20 is a timing diagram illustrating an example of a representation of a refresh operation of a semiconductor device according to an embodiment.

The timing diagram illustrated in FIG. 20 is merely an example of suitable timing diagrams for the refresh operation. Accordingly, in some embodiments, any other timing diagrams may be used to perform and terminate the refresh operation.

An operation of the semiconductor device having an aforementioned configuration will be described hereinafter in conjunction with an example in which the refresh operation starts during the power-down operation and terminates after the power-down operation.

The command decoder 10_1 may decode the commands CMD<1:N> to generate the multi-operation signal PD_SR is enabled to have a logic "high" level, in response to the chip selection signal CS.

The first shifting circuit 211_1 of the power-down signal generation circuit 21_1 may shift the multi-operation signal PD_SR in synchronization with the clock CLK to generate the power-down entry signal PENT which is enabled to have a logic "low" level.

The power-down signal output circuit 213_1 of the power-down signal generation circuit 21_1 may generate the power-down signal PDE having a logic "high" level in response to the power-down entry signal PENT having a logic "low" level.

The memory circuit 50_1 may perform the power-down operation in response to the power-down signal PDE having a logic "high" level.

The refresh signal output circuit 221_1 of the refresh signal generation circuit 22_1 may generate the refresh signal SREF which is enabled to have a logic "high" level in response to the multi-operation signal PD_SR having a logic "high" level and the operation selection signal TLCA having a logic "high" level.

The memory circuit 50_1 may perform the refresh operation in response to the refresh signal SREF having a logic "high" level.

The second shifting circuit 212_1 of the power-down signal generation circuit 21_1 may shift the chip selection signal CS by the first set period corresponding to the power-down operation period to generate the power-down exit signal PEXT having a logic "high" level.

The power-down signal output circuit 213_1 of the power-down signal generation circuit 21_1 may generate the power-down signal PDE having a logic "low" level in response to the power-down exit signal PEXT having a logic "high" level.

In such a case, the refresh control signal CS_SREF having a logic "high" level may be inputted to the termination signal generation circuit 30_1 to terminate the refresh operation.

The termination signal generation circuit 30_1 may generate the termination signal PSRX which is enabled to have a logic "high" level in response to the refresh control signal CS_SREF having a logic "high" level.

The refresh control circuit 40_1 may generate the refresh termination signal SRXB which is enabled to have a logic "low" level in response to the termination signal PSRX having a logic "high" level, in synchronization with the clock signal CLK.

The memory circuit 50_1 may terminate the power-down operation in response to the power-down signal PDE having a logic "low" level.

The delay circuit 222_1 of the refresh signal generation circuit 22_1 may delay the refresh signal SREF by the second set period to generate the refresh delay signal SREFD having a logic "low" level.

The logic circuit 223_1 of the refresh signal generation circuit 22_1 may generate the refresh exit signal SREX having a logic "high" level in response to the power-down signal PDE having a logic "low" level, the refresh termination signal SRXB having a logic "low" level, and the refresh delay signal SREFD having a logic "low" level.

The refresh signal output circuit 221_1 of the refresh signal generation circuit 22_1 may generate the refresh signal SREF which is disabled to have a logic "low" level in response to the refresh exit signal SREX having a logic "high" level.

The memory circuit 50_1 may terminate the refresh operation in response to the refresh signal SREF having a logic "low" level.

The semiconductor device having an aforementioned configuration may internally perform a power-down operation and a refresh operation according to a multi-operation signal and an operation selection signal which are generated from commands without any external signal for controlling the power-down operation and the refresh operation.

Figure 21:
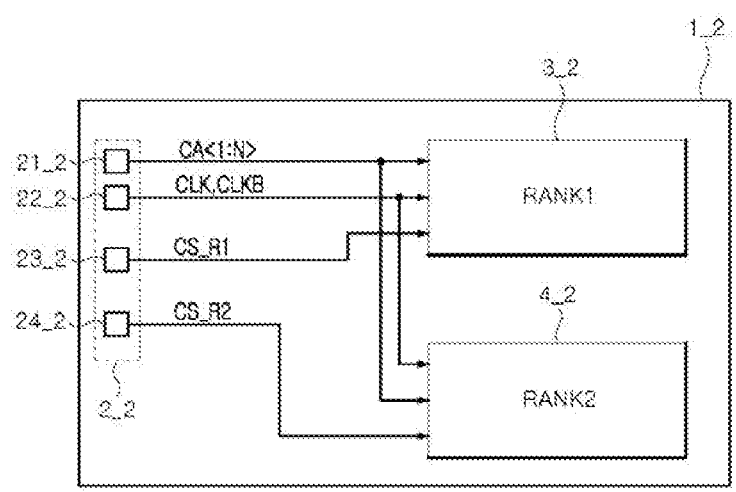
FIG. 21 is a block diagram illustrating a configuration of a semiconductor device according to an embodiment.

As illustrated in FIG. 21, a semiconductor device 1_2 according to an embodiment may include an input circuit 2_2, a first rank 3_2 and a second rank 4_2.

The input circuit 2_2 may include a first pin 21_2, a second pin 22_2, a third pin 23_2 and a fourth pin 24_2. The first pin 21_2 may receive a command/address signal CA<1:N> from an external device (not shown). The command/address signal CA<1:N> may include at least one of a command and an address which are outputted from the external device. The second pin 22_2 may receive a clock signal CLK and an inverted clock signal CLKB from the external device. Although the second pin 22_2 is illustrated as a single pin in FIG. 21, the second pin 22_2 may include a plurality of pins. The third pin 23_2 may receive a first rank selection signal CS_R1 from the external device. The first rank selection signal CS_R1 may be a signal which is enabled for operation of the first rank 3_2. The fourth pin 24_2 may receive a second rank selection signal CS_R2 from the external device. The second rank selection signal CS_R2 may be a signal which is enabled for operation of the second rank 4_2.

The first rank 3_2 may share the input circuit 2_2 with the second rank 4_2, where the first rank 3_2 and the second rank 4_2 receive the command/address signal CA<1:N>, the clock signal CLK and the inverted clock signal CLKB from the input circuit 2_2. The first rank 3_2 may perform an internal control operation on the semiconductor device 1_2 if the first rank selection signal CS_R1 is enabled in synchronization with an edge of the clock signal CLK. The internal control operation of the semiconductor device 1_2 may be any one of a mode register read operation, a read operation and a write operation. The first rank 3_2 may perform a termination operation without performing an internal control operation if the first rank selection signal CS_R1 maintains an enabled state in synchronization with at least one of a first edge and a second edge of the clock signal CLK, which are sequentially and continuously created. The second rank 4_2 may perform the internal control operation of the semiconductor device 1_2 if the second rank selection signal CS_R2 is enabled in synchronization with an edge of the clock signal CLK. The second rank 4_2 may perform the termination operation if the second rank selection signal CS_R2 maintains an enabled state in synchronization with edges of the clock signal CLK, which are sequentially and continuously created.

Figure 22:
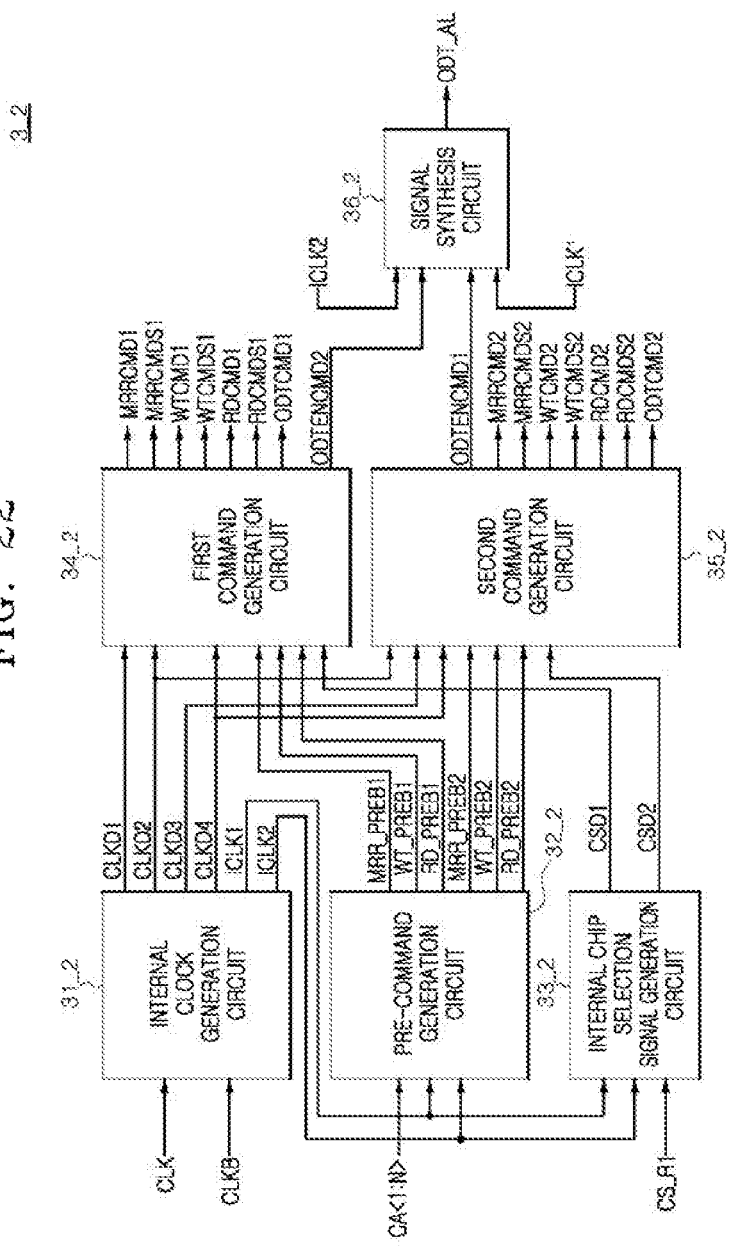
FIG. 22 is a block diagram illustrating a configuration of a first rank included in the semiconductor device of FIG. 21.

Referring to FIG. 22, the first rank 3_2 may include an internal clock generation circuit 31_2, a pre-command generation circuit 32_2, an internal chip selection signal generation circuit 33_2, a first command generation circuit 34_2, a second command generation circuit 35_2 and a signal synthesis circuit 36_2.

The internal clock generation circuit 31_2 may receive the clock signal CLK and the inverted clock signal CLKB to generate a first internal clock signal ICLK1, a second internal clock signal ICLK2, a first delayed clock signal CLKD1, a second delayed clock signal CLKD2, a third delayed clock signal CLKD3 and a fourth delayed clock signal CLKD4. The internal clock generation circuit 31_2 may divide the clock signal CLK and the inverted clock signal CLKB to generate the first internal clock signal ICLK1 and the second internal clock signal ICLK2. The first internal clock signal ICLK1 and the second internal clock signal ICLK2 may be generated to correspond to two-division signals that are set to have a cycle time which is twice the cycle time of the clock signal CLK and the inverted clock signal CLKB. The first internal clock signal ICLK1 may be set to have rising edges occurring in synchronization with an odd-number of rising edges (or even-number of rising edges according to some embodiments) of the clock signal CLK using a predetermined point of time as a reference point of time. The second internal clock signal ICLK2 may be set to have rising edges occurring in synchronization with an even-number of rising edges (or odd-number of rising edges according to some embodiments) of the clock signal CLK using the predetermined point of time as the reference point of time. The internal clock generation circuit 31_2 may delay the first internal clock signal ICLK1 to generate the first delayed clock signal CLKD1 and the second delayed clock signal CLKD2. A delay time for generating the first delayed clock signal CLKD1 from the first internal clock signal ICLK1 may be different from a delay time for generating the second delayed clock signal CLKD2 from the first internal clock signal ICLK1. In addition, the internal clock generation circuit 31_2 may delay the second internal clock signal ICLK2 to generate the third delayed clock signal CLKD3 and the fourth delayed clock signal CLKD4. A delay time for generating the third delayed clock signal CLKD3 from the second internal clock signal ICLK2 may be different from a delay time for generating the fourth delayed clock signal CLKD4 from the second internal clock signal ICLK2.

The pre-command generation circuit 32_2 may generate a first pre-command, such as a first pre-mode register read command MRR_PREB1, a first pre-write command WT_PREB1, a first pre-read command RD_PREB1, or a second pre-command, such as a second pre-mode register read command MRR_PREB2, a second pre-write command WT_PREB2 and a second pre-read command RD_PREB2 from the command/address signal CA<1:N>, in response to the first and second internal clock signals ICLK1 and ICLK2. The pre-command generation circuit 32_2 may latch and decode a buffered signal of the command/address signal CA<1:N> to generate the first pre-mode register read command MRR_PREB1, the first pre-write command WT_PREB1 and the first pre-read command RD_PREB1, in response to the first internal clock signal ICLK1. The first pre-mode register read command MRR_PREB1 may be set to be enabled for the mode register read operation which is performed in synchronization with a rising edge of the first internal clock signal ICLK1. The first pre-write command WT_PREB1 may be set to be enabled for the write operation which is performed in synchronization with a rising edge of the first internal clock signal ICLK1. The first pre-read command RD_PREB1 may be set to be enabled for the read operation which is performed in synchronization with a rising edge of the first internal clock signal ICLK1. The pre-command generation circuit 32_2 may latch and decode a buffered signal of the command/address signal CA<1:N> to generate the second pre-mode register read command MRR_PREB2, the second pre-write command WT_PREB2 and the second pre-read command RD_PREB2, in response to the second internal clock signal ICLK2. The second pre-mode register read command MRR_PREB2 may be set to be enabled for the mode register read operation which is performed in synchronization with a rising edge of the second internal clock signal ICLK2. The second pre-write command WT_PREB2 may be set to be enabled for the write operation which is performed in synchronization with a rising edge of the second internal clock signal ICLK2. The second pre-read command RD_PREB2 may be set to be enabled for the read operation which is performed in synchronization with a rising edge of the second internal clock signal ICLK2.

The internal chip selection signal generation circuit 33_2 may generate a first delayed chip selection signal CSD1 and a second delayed chip selection signal CSD2 from the first rank selection signal CS_R1 in response to the first internal clock signal ICLK1 and the second internal clock signal ICLK2. The internal chip selection signal generation circuit 33_2 may latch and delay a buffered signal of the first rank selection signal CS_R1 to generate the first delayed chip selection signal CSD1 in synchronization with the first internal clock signal ICLK1. In addition, the internal chip selection signal generation circuit 33_2 may latch and delay a buffered signal of the first rank selection signal CS_R1 to generate the second delayed chip selection signal CSD2 in synchronization with the second internal clock signal ICLK2.

The first command generation circuit 34_2 may generate a first mode register read command MRRCMD1, a first shift mode register read command MRRCMDS1, a first write command WTCMD1, a first shift write command WTCMDS1, a first read command RDCMD1, a first shift read command RDCMDS1, a first termination command ODTCMD1 and a second termination enable command ODTENCMD2 from the first pre-mode register read command MRR_PREB1, the first pre-write command WT_PREB1 and the first pre-read command RD_PREB1. The first command generation circuit 34_2 may generate the first command in response to the first delayed clock signal CLKD1, the second delayed clock signal CLKD2, the fourth delayed clock signal CLKD4 and the first delayed chip selection signal CSD1. The first command generation circuit 34_2 may generate the first mode register read command MRRCMD1, the first shift mode register read command MRRCMDS1, the first write command WTCMD1, the first shift write command WTCMDS1, the first read command RDCMD1 and the first shift read command RDCMDS1, one of which is selectively enabled to perform the internal control operation in synchronization with the first delayed clock signal CLKD1, if an enabled first delayed chip selection signal CSD1 is inputted. The first mode register read command MRRCMD1 and the first shift mode register read command MRRCMDS1 may be enabled to perform the mode register read operation of the internal control operation. The first write command WTCMD1 and the first shift write command WTCMDS1 may be enabled to perform the write operation of the internal control operation. The first read command RDCMD1 and the first shift read command RDCMDS1 may be enabled to perform the read operation of the internal control operation. The first command generation circuit 34_2 may also generate the first termination command ODTCMD1 which is enabled if the internal control operation is performed. In such a case, the second termination enable command ODTENCMD2 may maintain a disabled state. The first command generation circuit 34_2 may generate the second termination enable command ODTENCMD2 which is enabled in synchronization with the first delayed clock signal CLKD1, if the first delayed chip selection signal CSD1 has an enabled state after a second termination command ODTCMD2 having an enabled state is generated by the second command generation circuit 35_2. Further, the first command generation circuit 34_2 may terminate generation of the first command and the first termination command ODTCMD1 if the second termination command ODTCMD2 is enabled. A first command may include the first mode register read command MRRCMD1, the first write command WTCMD1, and the first read command RDCMD1. A configuration and an operation of the first command generation circuit 34_2 will be described more fully with reference to FIG. 26 later.

The second command generation circuit 35_2 may generate a second mode register read command MRRCMD2, a second shift mode register read command MRRCMDS2, a second write command WTCMD2, a second shift write command WTCMDS2, a second read command RDCMD2, a second shift read command RDCMDS2, the second termination command ODTCMD2 and a first termination enable command ODTENCMD1 from the second pre-mode register read command MRR_PREB2, the second pre-write command WT_PREB2 and the second pre-read command RD_PREB2, in response to the second delayed clock signal CLKD2, the third delayed clock signal CLKD3, the fourth delayed clock signal CLKD4 and the second delayed chip selection signal CSD2. The second command generation circuit 35_2 may generate the second mode register read command MRRCMD2, the second shift mode register read command MRRCMDS2, the second write command WTCMD2, the second shift write command WTCMDS2, the second read command RDCMD2 and the second shift read command RDCMDS2, one of which is selectively enabled to perform the internal control operation in synchronization with the third delayed clock signal CLKD3, if an enabled second delayed chip selection signal CSD2 is inputted. The second mode register read command MRRCMD2 and the second shift mode register read command MRRCMDS2 may be enabled to perform the mode register read operation of the internal control operation. The second write command WTCMD2 and the second shift write command WTCMDS2 may be enabled to perform the write operation of the internal control operation. The second read command RDCMD2 and the second shift read command RDCMDS2 may be enabled to perform the read operation of the internal control operation. The second command generation circuit 35_2 may also generate the second termination command ODTCMD2 which is enabled if the internal control operation is performed. In such a case, the first termination enable command ODTENCMD1 may maintain a disabled state. The second command generation circuit 35_2 may generate the first termination enable command ODTENCMD1 which is enabled in synchronization with the third delayed clock signal CLKD3, if the second delayed chip selection signal CSD2 is enabled after an enabled first termination command ODTCMD1 is generated in the first command generation circuit 34_2. Further, the second command generation circuit 35_2 may terminate generation of the second command and the second termination command ODTCMD2 if the first termination command ODTCMD1 is enabled. A second command may include the second mode register read command MRRCMD2, the second write command WTCMD2, and the second read command RDCMD2. A configuration and an operation of the second command generation circuit 35_2 will be described more fully with reference to FIG. 27 later.

The signal synthesis circuit 36_2 may generate a termination latency signal ODT_AL from the first termination enable command ODTENCMD1 and the second termination enable command ODTENCMD2 in response to the first internal clock signal ICLK1 and the second internal clock signal ICLK2. The signal synthesis circuit 36_2 may shift the first termination enable command ODTENCMD1 to generate the termination latency signal ODT_AL in synchronization with the first internal clock signal ICLK1. The signal synthesis circuit 36_2 may shift the second termination enable command ODTENCMD2 to generate the termination latency signal ODT_AL in synchronization with the second internal clock signal ICLK2. The signal synthesis circuit 36_2 may shift the first termination enable command ODTENCMD1 to generate the termination latency signal ODT_AL if the first internal clock signal ICLK1 is enabled, and the signal synthesis circuit 36_2 may shift the second termination enable command ODTENCMD2 to generate the termination latency signal ODT_AL if the second internal clock signal ICLK2 is enabled.

Figure 23:
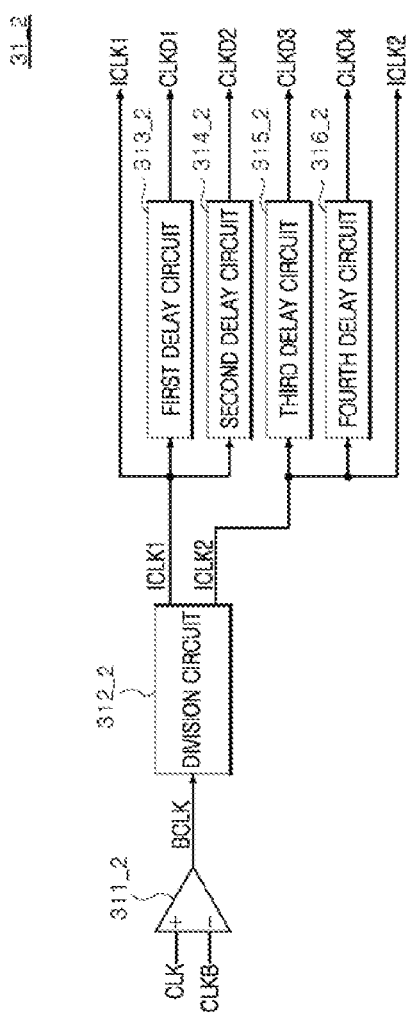
FIG. 23 is a block diagram illustrating a configuration of an internal clock generation circuit included in the first rank of FIG. 22.

Referring to FIG. 23, the internal clock generation circuit 31_2 may include a clock input buffer 311_2, a division circuit 312_2, a first delay circuit 313_2, a second delay circuit 314_2, a third delay circuit 315_2 and a fourth delay circuit 316_2.

The clock input buffer 311_2 may compare the clock signal CLK with the inverted clock signal CLKB to generate a buffered clock signal BCLK. The buffered clock signal BCLK may correspond to a signal which is generated by buffering the clock signal CLK.

The division circuit 312_2 may divide the buffered clock signal BCLK to generate the first internal clock signal ICLK1 and the second internal clock signal ICLK2. The first internal clock signal ICLK1 and the second internal clock signal ICLK2 may be generated to be two-division signals that are set to have a cycle time which is twice a cycle time of the clock signal CLK and the inverted clock signal CLKB. The first internal clock signal ICLK1 may be set to have rising edges occurring in synchronization with odd-numbered rising edges (or even-numbered rising edges according to some embodiments) of the clock signal CLK using a predetermined point of time as a reference point of time. The second internal clock signal ICLK2 may be set to have rising edges occurring in synchronization with even-numbered rising edges (or odd-numbered rising edges according to some embodiments) of the clock signal CLK using the predetermined point of time as the reference point of time.

The first delay circuit 313_2 may delay the first internal clock signal ICLK1 to generate the first delayed clock signal CLKD1. The second delay circuit 314_2 may delay the first internal clock signal ICLK1 to generate the second delayed clock signal CLKD2. The third delay circuit 315_2 may delay the second internal clock signal ICLK2 to generate the third delayed clock signal CLKD3. The fourth delay circuit 316_2 may delay the second internal clock signal ICLK2 to generate the fourth delayed clock signal CLKD4. Delay times of the first to fourth delay circuits 313_2, 314_2, 315_2 and 316_2 may be set to be different according to the embodiment.

Figure 24:
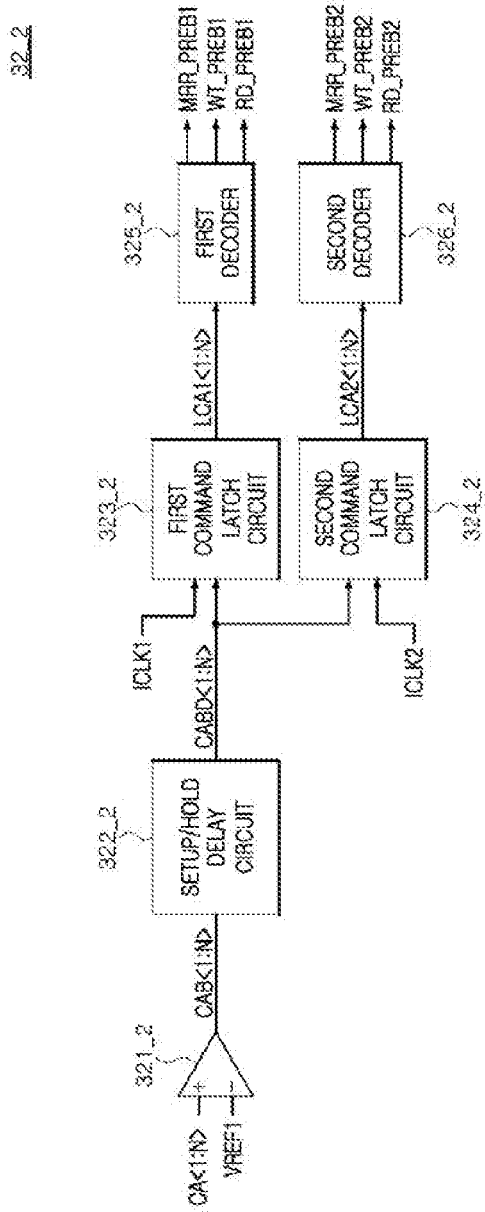
FIG. 24 is a block diagram illustrating a configuration of a pre-command generation circuit included in the first rank of FIG. 22.

Referring to FIG. 24, the pre-command generation circuit 32_2 may include a command input buffer 321_2, a setup/hold delay circuit 322_2, a first command latch circuit 323_2, a second command latch circuit 324_2, a first decoder 325_2 and a second decoder 326_2.

The command input buffer 321_2 may receive the command/address signal CA<1:N> to generate a buffered command/address signal CAB<1:N> in response to a first reference voltage VREF1. The command input buffer 321_2 may buffer the command/address signal CA<1:N> using the first reference voltage VREF1 as a reference voltage to generate the buffered command/address signal CAB<1:N>.

The setup/hold delay circuit 322_2 may delay the buffered command/address signal CAB<1:N> to generate a delayed command/address signal CABD<1:N>. The setup/hold delay circuit 322_2 may delay the buffered command/address signal CAB<1:N> for a predetermined delay time so that the delayed command/address signal CABD<1:N> is generated together with a setup/hold time.

The first command latch circuit 323_2 may latch the delayed command/address signal CABD<1:N> to generate a first latched command/address signal LCA1<1:N> in response to the first internal clock signal ICLK1. The first command latch circuit 323_2 may latch the delayed command/address signal CABD<1:N> in synchronization with a rising edge (or a falling edge according to some embodiments) of the first internal clock signal ICLK1.

The second command latch circuit 324_2 may latch the delayed command/address signal CABD<1:N> to generate a second latched command/address signal LCA2<1:N> in response to the second internal clock signal ICLK2. The second command latch circuit 324_2 may latch the delayed command/address signal CABD<1:N> in synchronization with a rising edge (or a falling edge according to some embodiments) of the second internal clock signal ICLK2.

The first decoder 325_2 may decode the first latched command/address signal LCA1<1:N> to generate the first pre-mode register read command MRR_PREB1, the first pre-write command WT_PREB1 and the first pre-read command RD_PREB1. One of the first pre-mode register read command MRR_PREB1, the first pre-write command WT_PREB1 and the first pre-read command RD_PREB1 may be selectively enabled according to a logic level combination of bits included in the first latched command/address signal LCA1<1:N>.

The second decoder 326_2 may decode the second latched command/address signal LCA2<1:N> to generate the second pre-mode register read command MRR_PREB2, the second pre-write command WT_PREB2 and the second pre-read command RD_PREB2. One of the second pre-mode register read command MRR_PREB2, the second pre-write command WT_PREB2 and the second pre-read command RD_PREB2 may be selectively enabled according to a logic level combination of bits included in the second latched command/address signal LCA2<1:N>.

Figure 25:
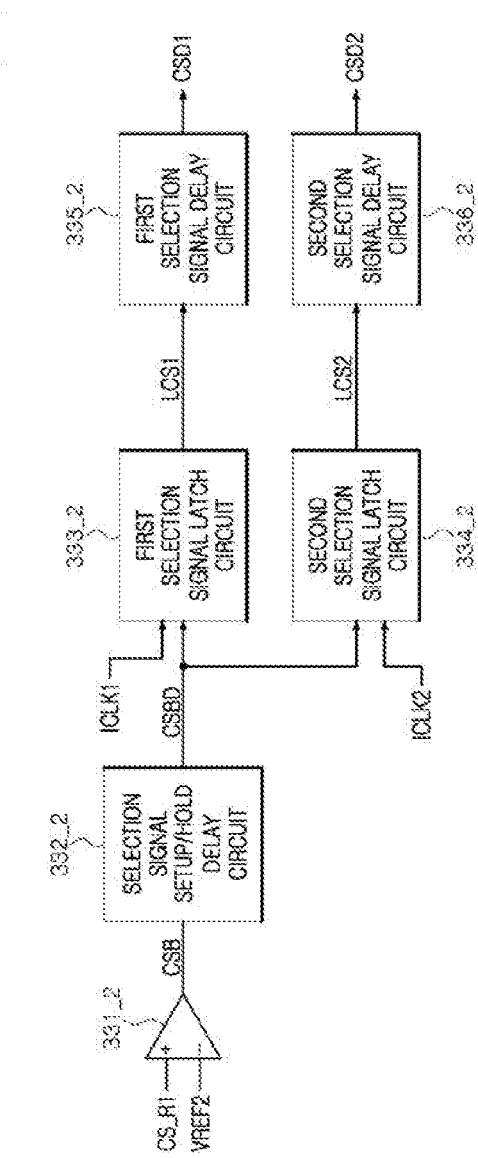
FIG. 25 is a block diagram illustrating a configuration of an internal chip selection signal generation circuit included in the first rank of FIG. 22.

Referring to FIG. 25, the internal chip selection signal generation circuit 33_2 may include a selection signal input buffer 331_2, a selection signal setup/hold delay circuit 332_2, a first selection signal latch circuit 333_2, a second selection signal latch circuit 334_2, a first selection signal delay circuit 335_2 and a second selection signal delay circuit 336_2.

The selection signal input buffer 331_2 may receive the first rank selection signal CS_R1 to generate a buffered selection signal CSB in response to a second reference voltage VREF2. The selection signal input buffer 331_2 may buffer the first rank selection signal CS_R1 using the second reference voltage VREF2 as a reference voltage to generate the buffered selection signal CSB.

The selection signal setup/hold delay circuit 332_2 may delay the buffered selection signal CSB to generate a delayed selection signal CSBD. The selection signal setup/hold delay circuit 332_2 may delay the buffered selection signal CSB for a predetermined delay time so that the delayed selection signal CSBD is generated together with the setup/hold time.

The first selection signal latch circuit 333_2 may latch the delayed selection signal CSBD to generate a first latched selection signal LCS1 in response to the first internal clock signal ICLK1. The first selection signal latch circuit 333_2 may latch the delayed selection signal CSBD in synchronization with a rising edge (or a falling edge according to some embodiments) of the first internal clock signal ICLK1.

The second selection signal latch circuit 334_2 may latch the delayed selection signal CSBD to generate a second latched selection signal LCS2 in response to the second internal clock signal ICLK2. The second selection signal latch circuit 334_2 may latch the delayed selection signal CSBD in synchronization with a rising edge (or a falling edge according to some embodiments) of the second internal clock signal ICLK2.

The first selection signal delay circuit 335_2 may delay the first latched selection signal LCS1 for a predetermined delay time to generate the first delayed chip selection signal CSD1. The predetermined delay time of the first selection signal delay circuit 335_2 may be set to be different according to the embodiment.

The second selection signal delay circuit 336_2 may delay the second latched selection signal LCS2 for a predetermined delay time to generate the second delayed chip selection signal CSD2. The predetermined delay time of the second selection signal delay circuit 336_2 may be set to be different according to the embodiment.

Figure 26:
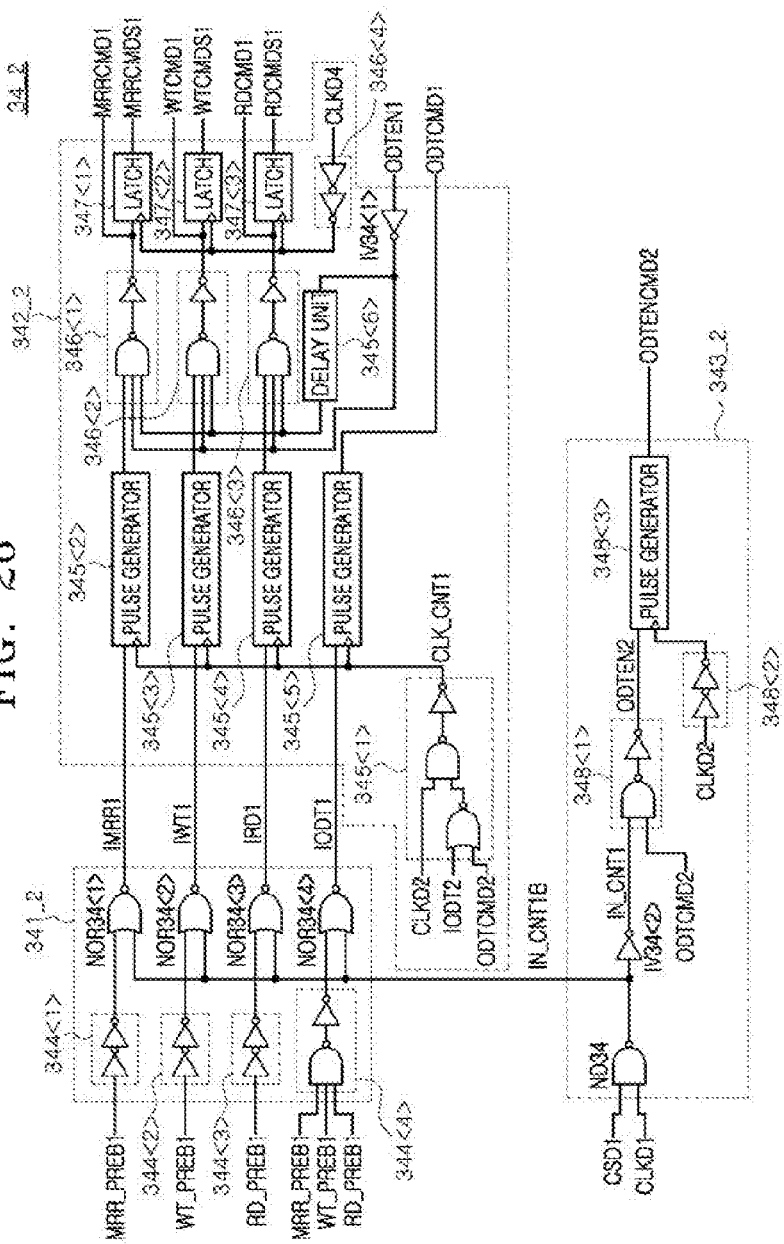
FIG. 26 is a block diagram illustrating a configuration of a first command generation circuit included in the first rank of FIG. 22.

Referring to FIG. 26, the first command generation circuit 34_2 may include a first internal command generation circuit 341_2, a first command output circuit 342_2 and a first input control signal generation circuit 343_2.

The first internal command generation circuit 341_2 may include buffers 344<1:4> and NOR gates NOR34<1:4>. The first internal command generation circuit 341_2 may generate at least one first internal command, such as, a first internal mode register read command IMRR1, a first internal write command IWT1, a first internal read command IRD1 and a first internal termination command IODT1 from the first pre-mode register read command MRR_PREB1, the first pre-write command WT_PREB1 and the first pre-read command RD_PREB1 while a first input control signal IN_CNT1B is enabled to have a logic "low" level. The first internal command generation circuit 341_2 may generate the first internal mode register read command IMRR1 and the first internal termination command IODT1 which are enabled to have a logic "high" level if the first pre-mode register read command MRR_PREB1 enabled to have a logic "low" level is inputted while the first input control signal IN_CNT1B is enabled to have a logic "low" level. The first internal command generation circuit 341_2 may generate the first internal write command IWT1 and the first internal termination command IODT1 which are enabled to have a logic "high" level if the first pre-write command WT_PREB1 enabled to have a logic "low" level is inputted while the first input control signal IN_CNT1B is enabled to have a logic "low" level. The first internal command generation circuit 341_2 may generate the first internal read command IRD1 and the first internal termination command IODT1 which are enabled to have a logic "high" level if the first pre-read command RD_PREB1, enabled to have a logic "low" level, is inputted while the first input control signal IN_CNT1B is enabled to have a logic "low" level.

The first command output circuit 342_2 may include a first control clock generator 345<1>, pulse generators 345<2:5>, an inverter IV34<1>, a delay unit 345<6>, logic units 346<1:3>, a buffer 346<4> and latches 347<1:3>. The first control clock generator 345<1> may generate a first control clock signal CLK_CNT1 having a logic "high" level while the second delayed clock signal CLKD2 has a logic "high" level and a second internal termination command IODT2 and the second termination command ODTCMD2 are disabled to have a logic "low" level. The pulse generators 345<2:4> may output pulses which are created when the first internal mode register read command IMRR1, the first internal write command IWT1 and the first internal read command IRD1, which are enabled, are inputted while the first control clock signal CLK_CNT1 having a logic "high" level is inputted. The pulse generator 345<5> may generate the first termination command ODTCMD1 for execution of a termination operation from a first pre-command, where the first termination command ODTCMD1 may be enabled if an enabled first internal termination command IODT1 is inputted while the first control clock signal CLK_CNT1 having a logic "high" level is inputted. The logic units 346<1:3> may generate the first mode register read command MRRCMD1, the first write command WTCMD1 and the first read command RDCMD1 in response to output signals of the inverter IV34<1> and the delay unit 345<6>. The logic units 346<1:3> may transmit the pulses generated in the pulse generators 345<2:4> to the latches 347<1:3> while a first termination enable signal ODTEN1 is disabled to have a logic "low" level. The logic units 346<1:3> may prevent the pulses generated in the pulse generators 345<2:4> from being transmitted to the latches 347<1:3>, while the first termination enable signal ODTEN1 is enabled to have a logic "high" level. Accordingly, the first command generation circuit 34_2 may terminate generation of the first command if the first termination enable signal ODTEN1 is enabled. The latches 347<1:3> may receive the pulses generated in the pulse generators 345<2:4> through the logic units 346<1:3> to generate the first shift mode register read command MRRCMDS1, the first shift write command WTCMDS1 and the first shift read command RDCMDS1, in synchronization with the fourth delayed clock signal CLKD4. The first command generation circuit 34_2 may be configured to generate the first command and the first termination command ODTCMD1 in response to the first input control signal IN_CNT1B and the first termination enable signal ODTEN1.

The first input control signal generation circuit 343_2 may include a NAND gate ND34, an inverter IV34<2>, a logic unit 348<1>, a buffer 348<2> and a pulse generator 348<3>. The NAND gate ND34 may generate the first input control signal IN_CNT1B which is enabled to have a logic "low" level in synchronization with a rising edge of the first delayed clock signal CLKD1 if the first delayed chip selection signal CSD1 enabled to have a logic "high" level is inputted. In one example, the first input control signal INTC1B may be enabled if the first rank selection signal CS_R1 (see FIG. 22) is enabled in synchronization with the first edge of the clock signal CLK (see FIG. 22). The inverter IV34<2> may inversely buffer the first input control signal IN_CNT1B to generate a first inverted input control signal IN_CNT1. The logic unit 348<1> may buffer the first inverted input control signal IN_CNT1 to generate a second termination enable signal ODTEN2 while the second termination command ODTCMD2 is enabled to have a logic "high" level. The second termination enable signal ODTEN2 may be enabled if the first input control signal IN_CNT1B is enabled while the second termination command ODTCMD2 is enabled. The pulse generator 348<3> may generate the second termination enable command ODTENCMD2, which is enabled in synchronization with a rising edge of the second delayed clock signal CLKD2 inputted through the buffer 348<2>, if the second termination enable signal ODTEN2 enabled is inputted. Enablement of the second termination enable command ODTENCMD2 means that a pulse is created according to the second termination enable signal ODTEN2.

Figure 27:
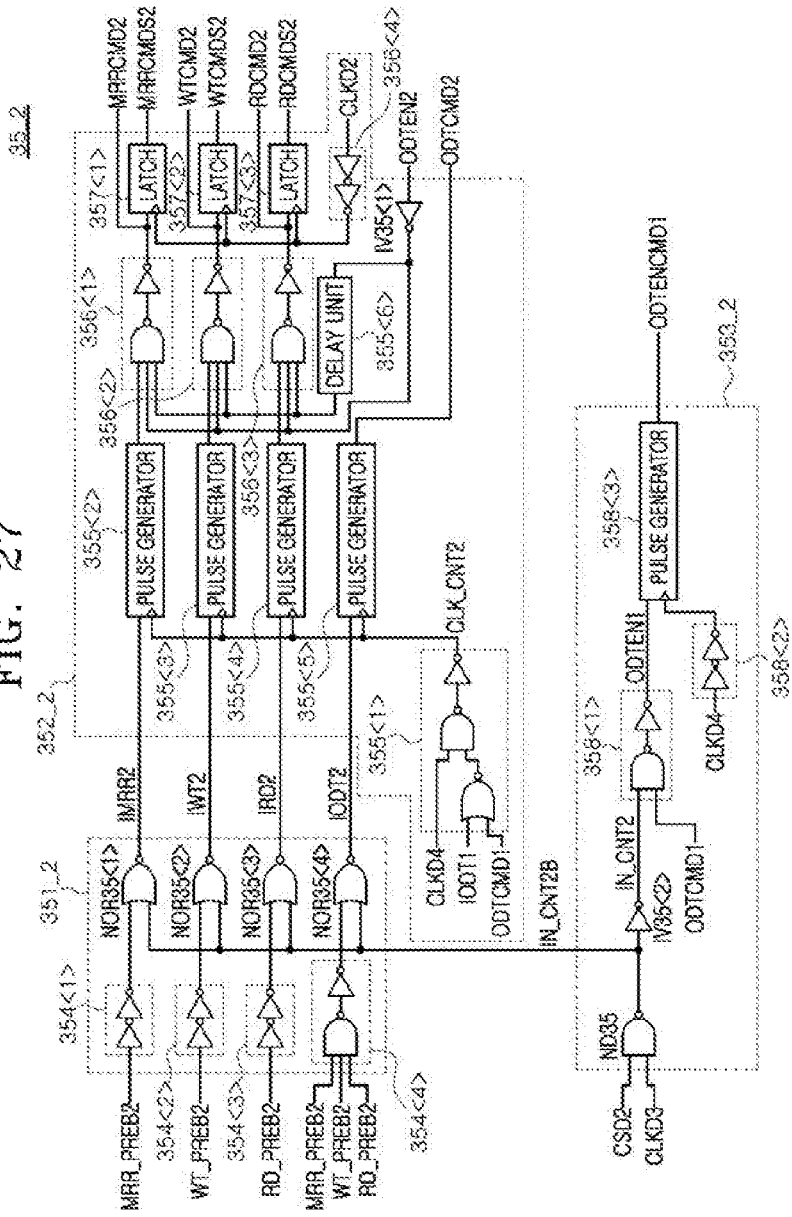
FIG. 27 is a block diagram illustrating a configuration of a second command generation circuit included in the first rank of FIG. 22.

Referring to FIG. 27, the second command generation circuit 35_2 may include a second internal command generation circuit 351_2, a second command output circuit 352_2 and a second input control signal generation circuit 353_2.

The second internal command generation circuit 351_2 may include buffers 354<1:4> and NOR gates NOR35<1:4>. The second internal command generation circuit 351_2 may generate a second internal mode register read command IMRR2, a second internal write command IWT2, a second internal read command IRD2 and the second internal termination command IODT2 from the second pre-mode register read command MRR_PREB2, the second pre-write command WT_PREB2 and the second pre-read command RD_PREB2 while a second input control signal IN_CNT2B is enabled to have a logic "low" level. The second internal command generation circuit 351_2 may generate the second internal mode register read command IMRR2 and the second internal termination command IODT2 which are enabled to have a logic "high" level if the second pre-mode register read command MRR_PREB2 enabled to have a logic "low" level is inputted while the second input control signal IN_CNT2B is enabled to have a logic "low" level. The second internal command generation circuit 351_2 may generate the second internal write command IWT2 and the second internal termination command IODT2 which are enabled to have a logic "high" level if the second pre-write command WT_PREB2 enabled to have a logic "low" level is inputted while the second input control signal IN_CNT2B is enabled to have a logic "low" level. The second internal command generation circuit 351_2 may generate the second internal read command IRD2 and the second internal termination command IODT2 which are enabled to have a logic "high" level if the second pre-read command RD_PREB2 enabled to have a logic "low" level is inputted while the second input control signal IN_CNT2B is enabled to have a logic "low" level.

The second command output circuit 352_2 may include a second control clock generator 355<1>, pulse generators 355<2:5>, an inverter IV35<1>, a delay unit 355<6>, logic units 356<1:3>, a buffer 356<4> and latches 357<1:3>. The second control clock generator 355<1> may generate a second control clock signal CLK_CNT2 having a logic "high" level while the fourth delayed clock signal CLKD4 has a logic "high" level and the first internal termination command IODT1 and the first termination command ODTCMD1 are disabled to have a logic "low" level. The pulse generators 355<2:4> may output pulses which are created when the second internal mode register read command IMRR2, the second internal write command IWT2 and the second internal read command IRD2, which are enabled, are inputted while the second control clock signal CLK_CNT2 having a logic "high" level is inputted. The pulse generator 355<5> may generate the second termination command ODTCMD2 for execution of the termination operation from a second pre-command, where the second termination command ODTCMD2 may be enabled if an enabled second internal termination command IODT2 is inputted while the second control clock signal CLK_CNT2 having a logic "high" level is inputted. The logic units 356<1:3> may generate the second mode register read command MRRCMD2, the second write command WTCMD2 and the second read command RDCMD2 in response to output signals of the inverter IV35<1> and the delay unit 355<6>. The logic units 356<1:3> may transmit the pulses generated in the pulse generators 355<2:4> to the latches 357<1:3> while the second termination enable signal ODTEN2 is disabled to have a logic "low" level. The logic units 356<1:3> may prevent the pulses generated in the pulse generators 355<2:4> from being transmitted to the latches 357<1:3>, while the second termination enable signal ODTEN2 is enabled to have a logic "high" level. In one example, the second command generation circuit 35_2 may terminate generation of the second command if the second termination enable signal ODTEN2 is enabled. The latches 357<1:3> may receive the pulses generated in the pulse generators 355<2:4> through the logic units 356<1:3> to generate the second shift mode register read command MRRCMDS2, the second shift write command WTCMDS2 and the second shift read command RDCMDS2, in synchronization with the second delayed clock signal CLKD2. The second command generation circuit 35_2 may generate the second command and the second termination command ODTCMD2 in response to a second input control signal IN_CNT2B and a second termination enable signal ODTEN2.

The second input control signal generation circuit 353_2 may include a NAND gate ND35, an inverter IV35<2>, a logic unit 358<1>, a buffer 358<2> and a pulse generator 358<3>. The NAND gate ND35 may generate the second input control signal IN_CNT2B which is enabled to have a logic "low" level in synchronization with a rising edge of the third delayed clock signal CLKD3 if the second delayed chip selection signal CSD2 enabled to have a logic "high" level is inputted. In one example, the second control signal IN_CNT2B may be enabled if the first rank selection signal CS_R1 is enabled in synchronization with the second edge of the clock signal. The inverter IV35<2> may inversely buffer the second input control signal IN_CNT2B to generate a second inverted input control signal IN_CNT2. The logic unit 358<1> may buffer the second inverted input control signal IN_CNT2 to generate the first termination enable signal ODTEN1 while the first termination command ODTCMD1 is enabled to have a logic "high" level. The pulse generator 358<3> may generate the first termination enable command ODTENCMD1 which is enabled in synchronization with a rising edge of the fourth delayed clock signal CLKD4 inputted through the buffer 358<2>, if an enabled first termination enable signal ODTEN1 is inputted. The first termination enable signal ODTEN1 may be enabled if the second input control signal IN_CNT2B is enabled while the first termination command ODTCMD1 is enabled. Enablement of the first termination enable command ODTENCMD1 means that a pulse is created according to the first termination enable signal ODTEN1.

Operations of the first rank 3_2 illustrated in FIGS. 22 to 27 will be described hereinafter with reference to FIGS. 28 and 29.

Figure 28:
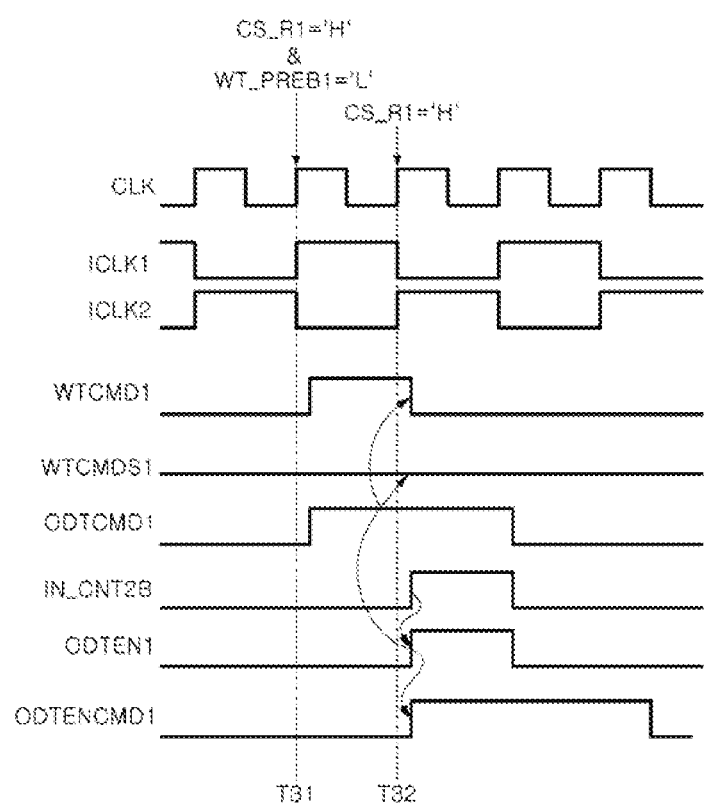
FIGS. 28 and 29 are timing diagrams illustrating operations of the first rank included in the semiconductor device of FIG. 21.

As illustrated in FIG. 28, if the first pre-write command WT_PREB1 enabled to have a logic "low" level is inputted in synchronization with a first rising edge of the clock signal CLK at a point of time "T31" while the first rank selection signal CS_R1 is enabled to have a logic "high" level, the first write command WTCMD1 and the first termination command ODTCMD1, which are enabled to have a logic "high" level, may be generated. The first write command WTCMD1 and the first termination command ODTCMD1 may be generated by the first internal command generation circuit 341_2 and the first command output circuit 342_2 included in the first command generation circuit 34_2 illustrated in FIG. 26. The first termination command ODTCMD1 enabled to have a logic "high" level may terminate a pulse generation operation of the pulse generators 355<2:5> included in the second command generation circuit 35_2 illustrated in FIG. 27, thereby preventing the second mode register read command MRRCMD2, the second shift mode register read command MRRCMDS2, the second write command WTCMD2, the second shift write command WTCMDS2, the second read command RDCMD2, the second shift read command RDCMDS2 and the second termination command ODTCMD2 from being enabled. If the first rank selection signal CS_R1 maintains a logic "high" level in synchronization with a second rising edge of the clock signal CLK at a point of time "T32", the second inverted input control signal IN_CNT2, the first termination enable signal ODTEN1 and the first termination enable command ODTENCMD1 may be sequentially enabled to have a logic "high" level. The second inverted input control signal IN_CNT2, the first termination enable signal ODTEN1 and the first termination enable command ODTENCMD1 may be generated by the second input control signal generation circuit 353_2 included in the second command generation circuit 35_2 illustrated in FIG. 27. The first termination enable signal ODTEN1 enabled to have a logic "high" level may be applied to the first command output circuit 342_2 included in the first command generation circuit 34_2 illustrated in FIG. 26 to disable the first write command WTCMD1 and the first shift write command WTCMDS1 to a logic "low" level.

As described above, the first rank 3_2 may perform only the termination operation without performing the write operation even though the first pre-write command WT_PREB1 enabled to have a logic "low" level is inputted in synchronization with the first rising edge of the clock signal CLK, if the first rank selection signal CS_R1 continuously maintains an enabled state corresponding to a logic "high" level at the first and second rising edges of the clock signal CLK. Although FIG. 28 illustrates an example in which the first pre-write command WT_PREB1 enabled to have a logic "low" level is inputted in synchronization with the first rising edge of the clock signal CLK, the present disclosure is not limited thereto. For example, in some embodiments, the first pre-mode register read command MRR_PREB1 or the first pre-read command RD_PREB1 enabled to have a logic "low" level may be inputted in synchronization with the first rising edge of the clock signal CLK. In such a case, the first rank 3_2 may perform only the termination operation without performing the mode register read operation or the read operation even though the first pre-mode register read command MRR_PREB1 or the first pre-read command RD_PREB1 enabled to have a logic "low" level is inputted in synchronization with the first rising edge of the clock signal CLK, if the first rank selection signal CS_R1 continuously maintains an enabled state corresponding to a logic "high" level at the first and second rising edges of the clock signal CLK.

Figure 29:
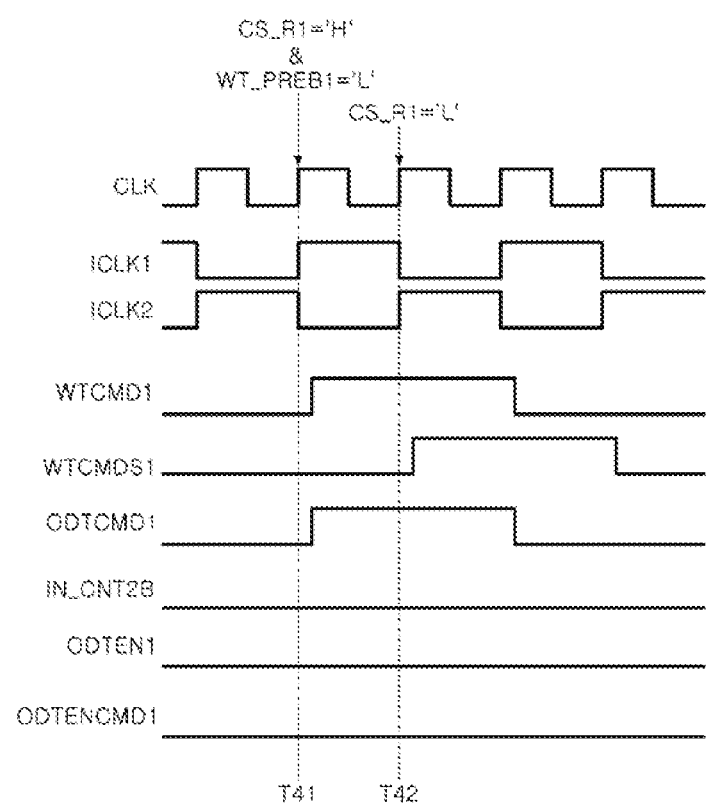

As illustrated in FIG. 29, if the first pre-write command WT_PREB1 enabled to have a logic "low" level is inputted in synchronization with a first rising edge of the clock signal CLK at a point of time "T41" while the first rank selection signal CS_R1 is enabled to have a logic "high" level, the first write command WTCMD1 and the first termination command ODTCMD1, which are enabled to have a logic "high" level, may be generated. The first write command WTCMD1 and the first termination command ODTCMD1 may be generated by the first internal command generation circuit 341_2 and the first command output circuit 342_2 included in the first command generation circuit 34_2 illustrated in FIG. 26. The first termination command ODTCMD1 enabled to have a logic "high" level may terminate a pulse generation operation of the pulse generators 355<2:5> included in the second command generation circuit 35_2 illustrated in FIG. 27, thereby preventing the second mode register read command MRRCMD2, the second shift mode register read command MRRCMDS2, the second write command WTCMD2, the second shift write command WTCMDS2, the second read command RDCMD2, the second shift read command RDCMDS2 and the second termination command ODTCMD2 from being enabled. If a logic level of the first rank selection signal CS_R1 is changed into a logic "low" level in synchronization with a second rising edge of the clock signal CLK at a point of time "T42", the second inverted input control signal IN_CNT2, the first termination enable signal ODTEN1 and the first termination enable command ODTENCMD1 may maintain a disabled state corresponding to a logic "low" level. Thus, the first termination command ODTCMD1 enabled to have a logic "high" level in synchronization with the point of time "T41" may be shifted to generate the first shift write command WTCMDS1 which is enabled to have a logic "high" level in synchronization with the point of time "T42" for execution of the write operation.

As described above, the first rank 3_2 may perform the write operation in response to the first pre-write command WT_PREB1 enabled to have a logic "low" level in synchronization with the first rising edge of the clock signal CLK, if the first rank selection signal CS_R1 has a logic "high" level at the first rising edge of the clock signal CLK and the logic level of the first rank selection signal CS_R1 is changed into a logic "low" level in synchronization with the second rising edge of the clock signal CLK. Although FIG. 29 illustrates an example in which the first pre-write command WT_PREB1 enabled to have a logic "low" level is inputted in synchronization with the first rising edge of the clock signal CLK, the present disclosure is not limited thereto. For example, in some embodiments, the first pre-mode register read command MRR_PREB1 or the first pre-read command RD_PREB1 enabled to have a logic "low" level may be inputted in synchronization with the first rising edge of the clock signal CLK. In such a case, the first rank 3_2 may perform the mode register read operation or the read operation in response to the first pre-mode register read command MRR_PREB1 or the first pre-read command RD_PREB1 enabled to have a logic "low" level in synchronization with the first rising edge of the clock signal CLK, if the first rank selection signal CS_R1 has a logic "high" level at the first rising edge of the clock signal CLK and the logic level of the first rank selection signal CS_R1 is changed into a logic "low" level in synchronization with the second rising edge of the clock signal CLK.

An operation of the semiconductor device according to an embodiment will be described hereinafter with reference to FIG. 30.

Figure 30:
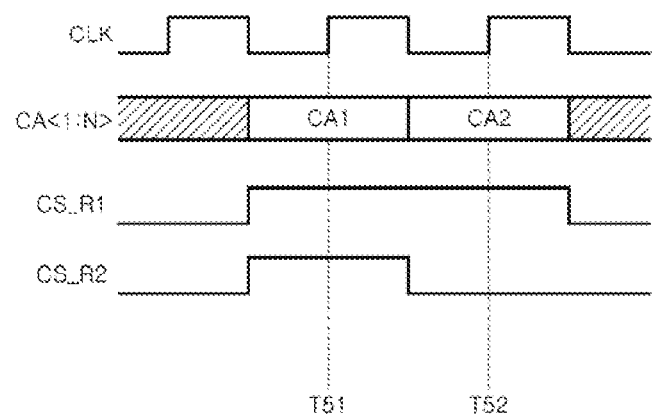
FIG. 30 is a timing diagram illustrating an operation of a semiconductor device according to an embodiment.

As illustrated in FIG. 30, if both of the first and second rank selection signals CS_R1 and CS_R2 have a logic "high" level at a first rising edge (i.e., a point of time "T51") of the clock signal CLK and the first and second rank selection signals CS_R1 and CS_R2 respectively have a logic "high" level and a logic "low" level at a second rising edge (i.e., a point of time "T52") of the clock signal CLK, the first rank 3_2 may perform only the termination operation without performing the internal control operation and the second rank 4_2 may perform only one of the mode register read operation, the read operation and the write operation. The first rank 3_2 may possibly not perform the internal control operation (i.e., the mode register read operation, the read operation or the write operation) in response to a first level combination CA1 of the command/address signal CA<1:N> inputted at the first rising edge (i.e., the point of time "T51") of the clock signal CLK and may perform only the termination operation in response to a second level combination CA2 of the command/address signal CA<1:N> inputted at the second rising edge (i.e., the point of time "T52") of the clock signal CLK. The second rank 4_2 may perform one of the mode register read operation, the read operation and the write operation in response to the first level combination CA1 of the command/address signal CA<1:N> inputted at the first rising edge (i.e., the point of time "T51") of the clock signal CLK.

Each of the ranks included in the semiconductor device according to an embodiment may perform only the termination operation without performing or blocking the internal control operation (i.e., the mode register read operation, the read operation or the write operation) in response to the command/address signal CA<1:N>, if a rank selection signal having a logic "high" level is continuously inputted at the rising edges of the clock signal CLK which are sequentially created. Because the semiconductor device according to the embodiment performs the termination operation in response to the command/address signal CA<1:N>, an additional pin may possibly not be required to receive a control signal for the termination operation. Moreover, the semiconductor device according to an embodiment may block generation of an unnecessary internal command during the termination operation to prevent malfunction of the semiconductor device. Accordingly, power consumption of the semiconductor device may be reduced.

Figure 31:
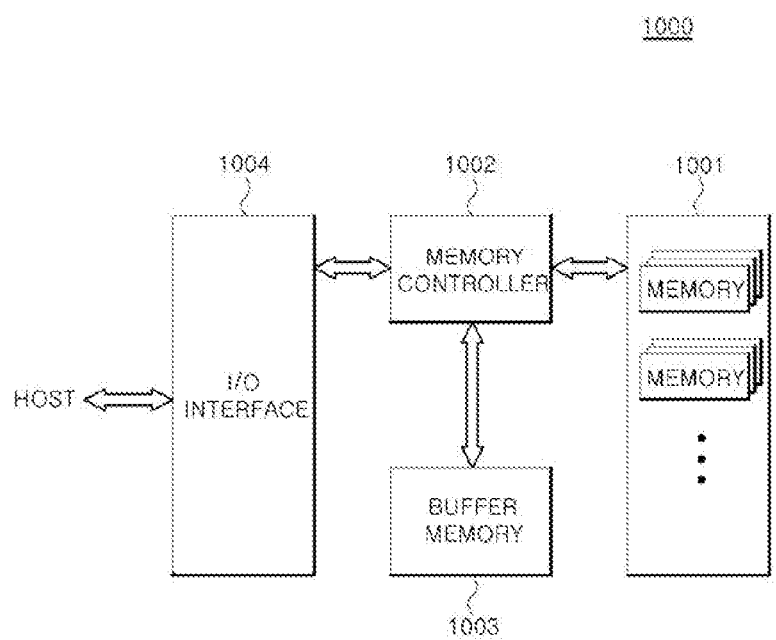
FIG. 31 is a block diagram illustrating an example of a representation of a configuration of an electronic system employing the semiconductor device illustrated in FIGS. 1 to 9 and 11-30.

The semiconductor device described with reference to FIGS. 1-9 and 11-30 may be applied to an electronic system that includes a memory system, a graphic system, a computing system, a mobile system, or the like. For example, as illustrated in FIG. 31, an electronic system 1000 according to an embodiment may include a data storage circuit 1001, a memory controller 1002, a buffer memory 1003, and an input/output (I/O) interface 1004.

In relation to FIG. 1, the data storage circuit 1001 may store data which are outputted from the memory controller 1002 or may read and output the stored data to the memory controller 1002, according to a control signal generated from the memory controller 1002. The data storage circuit 1001 may include the second semiconductor devices 2 illustrated in FIG. 1 or the semiconductor devices illustrated in FIG. 9. The data storage circuit 1001 may generate internal data having a logic level which is internally set regardless of logic levels of external data and may perform an initialization operation that stores the internal data in a memory cell array included in the data storage circuit 1001. The data storage circuit 1001 may include an ODT circuit (i.e., see FIG. 10) for preventing distortion of data. The ODT circuit may be designed not to operate during the initialization operation of the data storage circuit 1001. The data storage circuit 1001 may also include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 and the buffer memory 1003 or for outputting the data stored in the data storage circuit 1001 and the buffer memory 1003. The memory controller 1002 may include the first semiconductor devices 1 illustrated in FIG. 1. The memory controller 1002 may apply data and a strobe signal for strobing the data to the data storage circuit 1001. The strobe signal outputted from the memory controller 1002 may not be toggled during the initialization operation and may be toggled after the initialization operation terminates. Although FIG. 31 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

In relation to FIG. 10, the data storage circuit 1001 may store data which are outputted from the memory controller 1002 or may read and output the stored data to the memory controller 1002, according to a control signal generated from the memory controller 1002. The data storage circuit 1001 may include the semiconductor devices illustrated in FIG. 10. The data storage circuit 1001 may generate internal data having a logic level which is internally set regardless of logic levels of external data and may perform an initialization operation that stores the internal data in a memory cell array included in the data storage circuit 1001. The data storage circuit 1001 may include an On Die Termination (ODT) circuit (not illustrated) for preventing distortion of data. The ODT circuit may be designed not to operate during the initialization operation of the data storage circuit 1001. The data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. The memory controller 1002 may apply data and a strobe signal for strobing the data to the data storage circuit 1001. The strobe signal outputted from the memory controller 1002 may not be toggled during the initialization operation and may be toggled after the initialization operation terminates. Although FIG. 31 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data which are processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

In relation to FIG. 21, the data storage circuit 1001 may store data which are outputted from the memory controller 1002 or may read and output the stored data to the memory controller 1002, according to a control signal generated from the memory controller 1002. The data storage circuit 1001 may include the semiconductor device 1 illustrated in FIG. 21. Meanwhile, the data storage circuit 1001 may include a nonvolatile memory that can retain stored data of the data storage circuit 1001 even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 31 illustrates the memory controller 1002 with a single block, however, the memory controller 1002 may include one controller for controlling the data storage circuit 1001 comprised of a nonvolatile memory and another controller for controlling the buffer memory 1003 comprised of a volatile memory.

The buffer memory 1003 may temporarily store data which is processed by the memory controller 1002. That is, the buffer memory 1003 may temporarily store data which is outputted from or to be inputted to the data storage circuit 1001. The buffer memory 1003 may store data, which is outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multimedia card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

According to the above embodiments, a semiconductor device may perform a termination operation using a command/address signal even without an additional pin. Thus, the number of pins of the semiconductor device may be reduced.

Moreover, the semiconductor device according to the embodiments may suppress generation of internal commands for execution of a mode register read operation, a read operation and a write operation during a termination operation to prevent malfunction of the semiconductor device and to reduce power consumption of the semiconductor device.

A known technique for reducing the loading of a channel for transferring signals between a memory module and a memory controller, which is a technical feature of the present invention, is incorporated by reference in US Pub. No. 2017-0220294.

What is claimed is:

1. A semiconductor device comprising:
a refresh signal generation circuit configured to generate a refresh signal, indicating that a refresh operation is activated, based on command signals;
a power-down signal generation circuit comprised of a first and second shift registers having corresponding outputs, which are coupled to a power-down signal output circuit, which is configured to generate a power-down signal responsive to output from the shift registers, the generation of the power-down signal indicating that a power-down operation is activated, the power-down signal being enabled after the refresh operation terminates, and
wherein the refresh signal generation circuit further includes:
a delay circuit configured to delay the refresh signal by a set period to generate a refresh delay signal.

2. The semiconductor device of claim 1, further comprising a command decoder configured to decode the command signals and output a multi-operation signal based on a chip selection signal.

3. The semiconductor device of claim 2, wherein the refresh signal generation circuit is configured to generate the refresh signal based on the multi-operation signal and an operation selection signal.

4. The semiconductor device of claim 2,
wherein the power-down signal generation circuit is configured to generate the power-down signal based on a chip selection signal provided to one of the shift registers, a clock signal provided to one of the shift registers, and the multi-operation signal, which is also provided to one of the shift registers.

5. The semiconductor device of claim 3, wherein
the first shifting circuit is configured to shift the multi-operation signal in synchronization with the clock signal to generate a power-down entry signal; and
the second shifting circuit is configured to shift a chip selection signal in synchronization with the clock signal to generate a power-down exit signal.

6. The semiconductor device of claim 3, wherein the power-down generation circuit additionally comprises:
a power-down signal output circuit configured to generate the power-down signal, which is disabled based on a reset signal or a refresh termination signal and which is enabled from a point of time that the power-down entry signal is inputted till a point of time that the power-down exit signal is inputted.

7. The semiconductor device of claim 6, wherein the power-down signal output circuit includes:
a first driving circuit configured to drive a first node to generate the power-down signal based on the power-down entry signal and the power-down exit signal;
a second driving circuit configured to drive the first node to initialize the power-down signal based on the reset signal; and
a third driving circuit configured to drive the first node to initialize the power-down signal based on the refresh termination signal.

8. The semiconductor device of claim 4, wherein the command signals are input through a plurality of pads, and wherein the operation selection signal is input through a pad that is different from the plurality of pads.

9. The semiconductor device of claim 4, wherein the refresh operation and the power-down operation terminate their respective operations based on the chip selection signal.

10. The semiconductor device of claim 9,
wherein the refresh operation terminates when one or more cycles of the clock signal are toggled after the chip selection signal changes levels, and
wherein the power-down operation terminates before a cycle of the clock signal completes, after the chip selection signal changes levels.

11. The semiconductor device of claim 1, wherein the refresh signal is disabled when the refresh termination signal is input after the power-down operation terminates.

12. The semiconductor device of claim 1, wherein the refresh signal generation circuit includes:
a refresh signal output circuit configured to generate the refresh signal which is enabled based on the multi-operation signal and the operation selection signal and which is disabled based on a refresh exit signal.

13. The semiconductor device of claim 12, wherein the refresh signal output circuit includes:
a first control signal generation circuit configured to generate a first control signal which is enabled based on the multi-operation signal and the operation selection signal;

a second control signal generation circuit configured to generate a second control signal which is enabled based on a reset signal or the refresh exit signal; and a latch circuit configured to generate the refresh signal which is enabled based on the first control signal and which is disabled based on the second control signal.

14. The semiconductor device of claim 1, wherein the refresh signal generation circuit further includes:

a logic circuit configured to generate a refresh exit signal which is enabled if the multi-operation signal is enabled and a refresh delay signal or a refresh termination signal is input.

15. The semiconductor device of claim 1, further comprising:

a termination signal generation circuit configured to generate a termination signal which is enabled based on the refresh signal and a refresh control signal.

16. The semiconductor device of claim 15, wherein the termination signal generation circuit includes:

a fourth driving circuit configured to pull up a second node in response the refresh signal and configured to pull down the second node in response the refresh control signal.

17. The semiconductor device of claim 15, wherein the termination signal generation circuit includes:

a fifth driving circuit configured to pull up a second node based on a reset signal.

18. The semiconductor device of claim 15, wherein the termination signal generation circuit includes:

a buffer circuit configured to inversely buffer a signal of a second node to generate the termination signal.

19. The semiconductor device of claim 1, further comprising:

a refresh control circuit configured to generate the refresh termination signal which is enabled based on a termination signal in synchronization with a clock signal.

* * * * *